US006726848B2

(12) United States Patent
Hansen et al.

(10) Patent No.: US 6,726,848 B2
(45) Date of Patent: Apr. 27, 2004

(54) APPARATUS AND METHOD FOR SINGLE SUBSTRATE PROCESSING

(75) Inventors: Eric Hansen, Boise, ID (US); Victor Mimken, Boise, ID (US); Martin Bleck, Eagle, ID (US); M. Rao Yalamanchili, Eagle, ID (US); John Rosato, Boise, ID (US)

(73) Assignee: SCP Global Technologies, Inc., Boise, ID (US)

( * ) Notice: Subject to any disclaimer, the term of this patent is extended or adjusted under 35 U.S.C. 154(b) by 0 days.

(21) Appl. No.: 10/010,240

(22) Filed: Dec. 7, 2001

(65) Prior Publication Data

US 2003/0205559 A1 Nov. 6, 2003

(51) Int. Cl.[7] .............................................. H01L 21/00
(52) U.S. Cl. ...................... 216/109; 134/31; 134/186; 156/345.11; 216/99; 438/745
(58) Field of Search ............... 216/99, 109; 156/345.11; 134/1.3, 2, 3, 28, 30, 31, 34, 155, 186; 438/745

(56) References Cited

U.S. PATENT DOCUMENTS

| 5,017,236 A | 5/1991 | Moxness et al. ............... 134/1 |
| 5,090,432 A | 2/1992 | Bran ........................... 134/139 |
| 5,601,655 A | 2/1997 | Bok et al. ...................... 134/1 |
| 6,006,765 A | 12/1999 | Skrovan et al. ............. 134/1.3 |
| 6,192,600 B1 | 2/2001 | Bergman ..................... 34/267 |
| 6,240,938 B1 | 6/2001 | Oshinowo ................... 134/147 |
| 6,273,100 B1 | 8/2001 | Andreas et al. ............. 134/1.3 |
| 6,311,702 B1 | 11/2001 | Fishkin ....................... 134/1.3 |
| 6,328,814 B1 | 12/2001 | Fishkin et al. ................. 134/30 |

FOREIGN PATENT DOCUMENTS

| EP | 1 168 422 | 6/2001 |
| WO | WO 00/21692 | 4/2000 |

OTHER PUBLICATIONS

Patent Application Publication, Pub. No. US 2002/0016082, Feb. 7, 2002, corresponding to U.S. Appln. No. 09/892,269, filed Jun. 27, 2001, 24 pages in length.

*Primary Examiner*—William A. Powell
(74) *Attorney, Agent, or Firm*—Stallman & Pollock L.L.P.

(57) ABSTRACT

In a method for treating a semiconductor substrate, a single substrate is positioned in a single-substrate process chamber and subjected to wet etching, cleaning and/or drying steps. The single substrate may be exposed to etch or clean chemistry in the single-substrate processing chamber as turbulence is induced in the etch or clean chemistry to thin the boundary layer of fluid attached to the substrate. Megasonic energy and/or disturbances in the chamber surfaces may provide the turbulence for boundary layer thinning. According to another aspect of a method according to the present invention, megasonic energy may be directed into a region within the single-substrate process chamber to create a zone of boundary layer thinning across the substrate surface, and a single substrate may be translated through the zone during a rinsing or cleaning process within the chamber to optimize cleaning/rinsing performance within the zone.

120 Claims, 14 Drawing Sheets

APPARATUS AND METHOD FOR SINGLE SUBSTRATE PROCESSING

FIELD OF THE INVENTION

The present invention relates to the field of surface preparation systems and methods for semiconductor substrates and the like.

BACKGROUND OF THE INVENTION

In certain industries there are processes that must be used to bring objects to an extraordinarily high level of cleanliness. For example, in the fabrication of semiconductor substrates, multiple cleaning steps are typically required to remove impurities from the surfaces of the substrates before subsequent processing. The cleaning of a substrate, known as surface preparation, has for years been performed by collecting multiple substrates into a batch and subjecting the batch to a sequence of chemical and rinse steps and eventually to a final drying step. A typical surface preparation procedure may include etch, clean, rinse and dry steps. An etch step may involve immersing the substrates in an etch solution of HF to remove surface oxidation and metallic impurities and then thoroughly rinsing the substrates in high purity deionized water (DI) to remove etch chemicals from the substrates. During a typical cleaning step, the substrates are exposed to a cleaning solution that may include water, ammonia or hydrochloric acid, and hydrogen peroxide. After cleaning, the substrates are rinsed using ultra-pure water and then dried using one of several known drying processes.

Currently, there are several types of tools and methods used in industry to carry out the surface preparation process. The tool most prevalent in conventional cleaning applications is the immersion wet cleaning platform, or "wet bench." In wet bench processing, a batch of substrates is typically arranged on a substrate-carrying cassette. The cassette is dipped into a series of process vessels, where certain vessels contain chemicals needed for clean or etch functions, while others contain deionized water ("DI") for the rinsing of these chemicals from the substrate surfaces. The cleaning vessels may be provided with piezoelectric transducers that propagate megasonic energy into the cleaning solution. The megasonic energy enhances cleaning by inducing microcavitation in the cleaning solution, which helps to dislodge particles off of the substrate surfaces. After the substrates are etched and/or cleaned and then rinsed, they are dried. Often drying is facilitated using a solvent such as isopropyl alcohol (IPA), which reduces the surface tension of water attached to the substrate surface.

Another type of surface preparation tool and method utilized in the semiconductor industry is one in which a number of surface preparation steps (e.g. clean, etch, rinse and/or dry) may be performed on a batch of substrates within a single vessel. Tools of this type can eliminate substrate-transfer steps previously required by wet bench technology, and have thus gained acceptance in the industry due to their reduced risk of breakage, particle contamination and their reduction in footprint size.

Further desirable, however, is a chamber and method in which multiple surface preparation steps can be performed on a single substrate (e.g. a 200 mm, 300 mm or 450 mm diameter substrate), as opposed to a batch of substrates. It is thus an object of the present invention to provide a chamber and method for performing one or more surface preparation steps on a single substrate.

SUMMARY OF THE INVENTION

In one aspect of the present invention, a single substrate is positioned in a single-substrate process chamber and subjected to wet etching, cleaning and/or drying steps. According to another aspect of the present invention, a single substrate is exposed to etch or clean chemistry in the single-substrate processing chamber as boundary layer thinning is induced in the region of the substrate. According to yet another aspect of a method according to the present invention, boundary layer thinning is induced in a zone within the single-substrate process chamber, and a single substrate is translated through the zone during a process within the chamber.

DETAILED DESCRIPTION

Three embodiments of single substrate chambers and associated processes are described herein. Each of the described chambers/methods performs wet processing steps such as (but not limited to) etching, cleaning, rinsing and/or drying on a single substrate (such as, for example a semiconductor wafer substrate) using a single chamber. As will be appreciated from the description that follows, such chambers and methods are beneficial in that each substrate treated using the chamber/method is exposed to the same process conditions to which the other substrates undergoing the same process are exposed. This yields higher precision processing than seen in a batch system, in which a substrate positioned in one part of a substrate batch may be exposed to slightly different process conditions (such as fluid flow conditions, chemical concentrations, temperatures etc.) than a substrate positioned in a different part of the batch. For example, a substrate at the end of a longitudinal array of substrates may see different conditions than a substrate at the center of the same array. Such variations in conditions can yield batches lacking in uniformity between substrates.

Single substrate chambers/methods such as those described herein are further beneficial in that each substrate is exposed to process fluids for a shorter amount of time than is required in batch processing. Moreover, for applications where only a few substrates need processing (e.g. in a prototype engineering context), the individuals requiring the processed substrates need only wait a few minutes to receive the treated substrates, rather than waiting a full hour or more for the substrates to be processed in a batch-type chamber. Moreover, the chambers/methods described herein can be practiced using the same or smaller volumes of process fluids (on a substrate-per-substrate basis) than would be used in corresponding batch processes.

First Embodiment—Structure

Figure 1A:
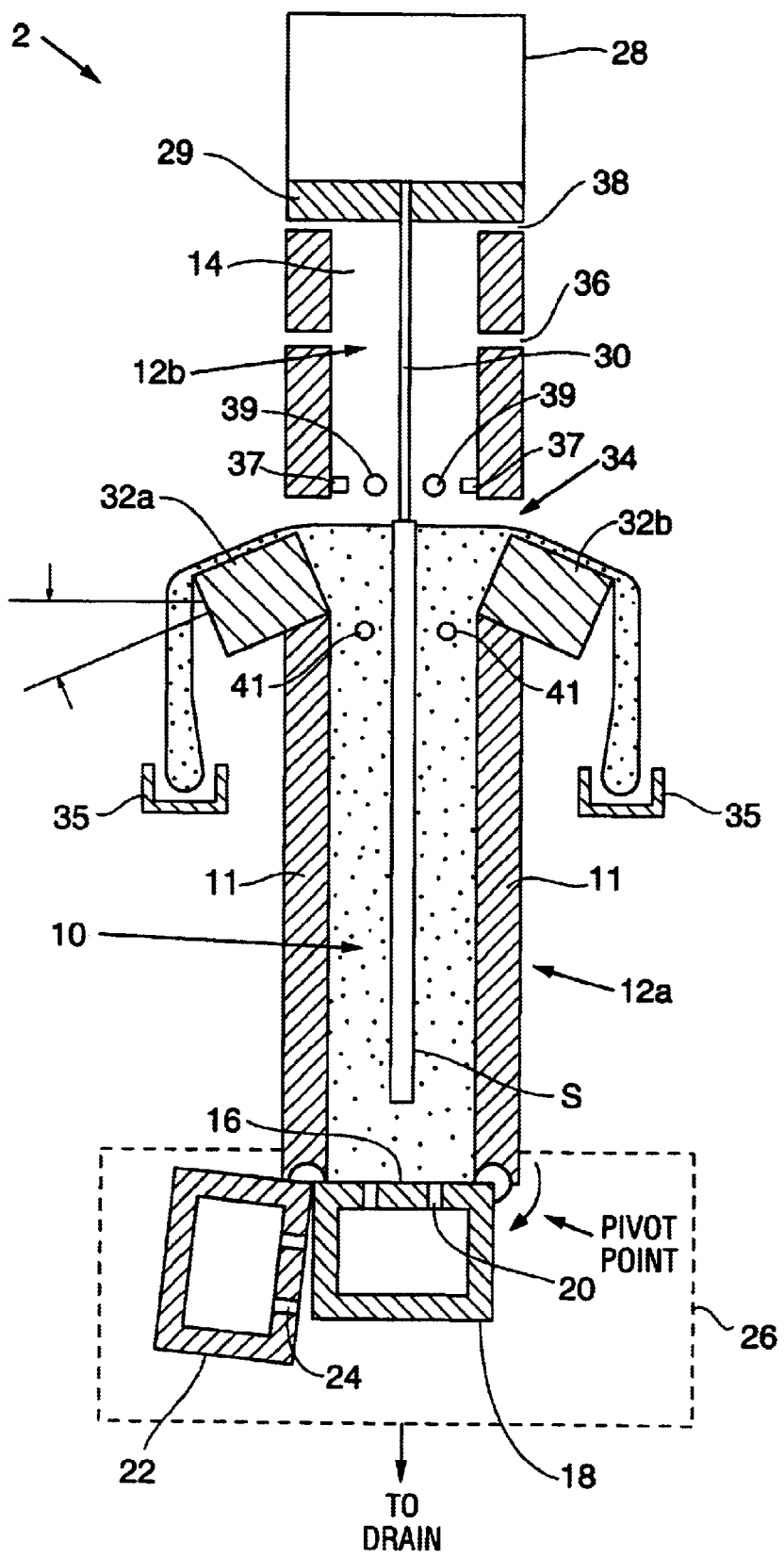
FIG. 1A is a schematic illustration of a single substrate processing chamber, showing the substrate positioned in the lower interior region of the chamber.

Features of a first embodiment of a single substrate processing chamber are schematically shown in FIGS. 1A–1D. Referring to FIG. 1A, a first embodiment 2 of a single substrate processing chamber includes a chamber 10 having sidewalls 11 defining a lower interior region 12a proportioned to receive a substrate S for processing, an upper interior region 12b, and an opening 14 in the upper interior region 12a.

The first embodiment includes a substrate transport device 28. Transport device includes an end effector 30 configured to engage a substrate S, and is driven by conventional automation (not shown) to move the substrate S through opening 14 into and out of the chamber 10 in an edgewise direction. Transport device 28 is further configured to cause end effector 30 to move the substrate between the lower interior region 12a and the upper interior region 12b, as described below in connection with operation of the device.

Transport device 28 may also carry a lid 29 that closes against opening 14 when the end effector 30 is lowered. The lid 29 may remain in place, even as the end effector moves the substrate between regions 12a, 12b during processing, and be later withdrawn so that the end effector 30 can remove substrate S from the chamber.

The upper end of the lower interior region 12a may be narrowed to include a throat section to increase the velocity of fluid flowing through the throat section from the lower section of the chamber. The bottom of the chamber 10 may be flat or contoured to conform to the shape of the lower edge of the substrate.

Fluid Handling System

The first embodiment 2 is preferably provided with a fluid handling system 26 configured to carry various process fluids (e.g. etch fluids, cleaning fluids, rinse water etc.) into the lower interior region 12b of chamber 10.

Figure 1B:
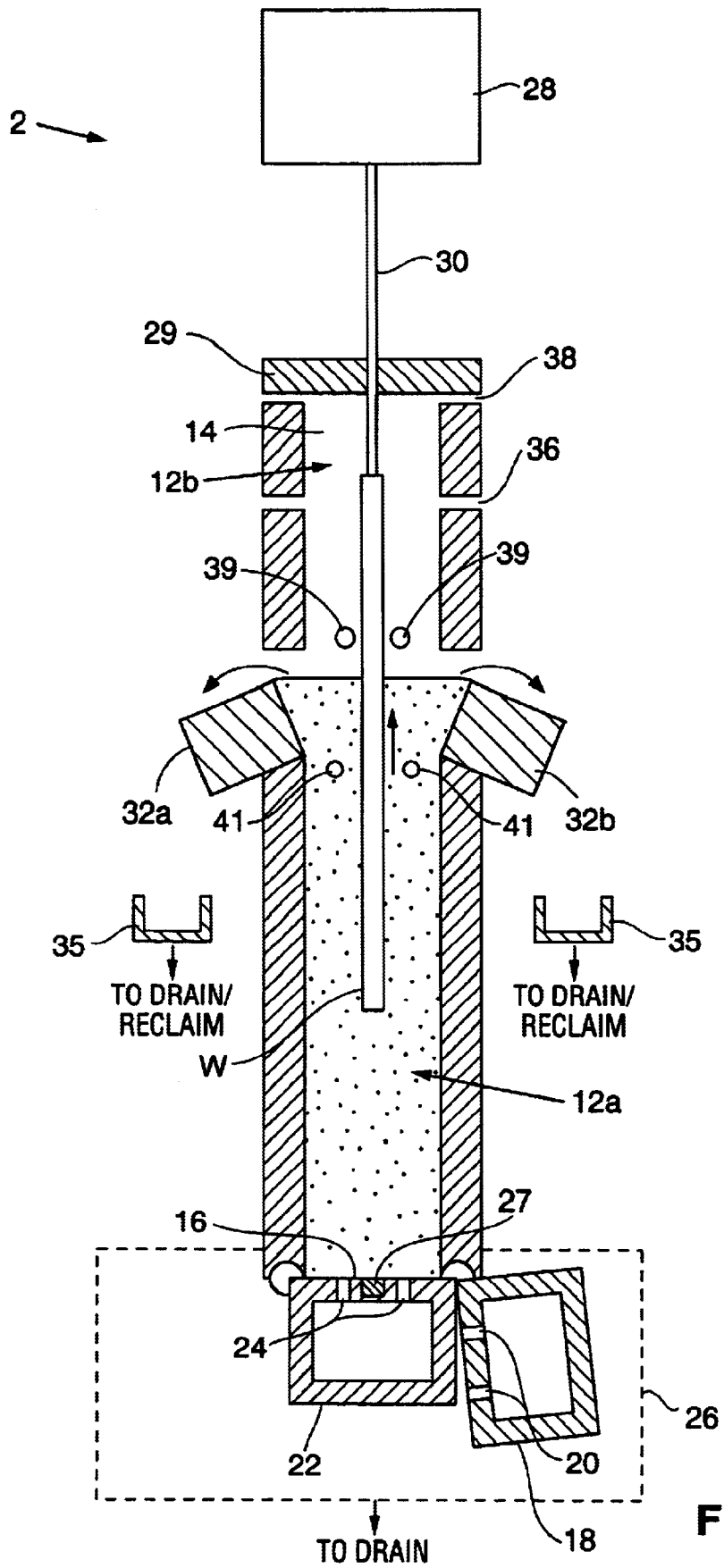
FIG. 1B is a schematic illustration of a single substrate processing chamber, showing the substrate positioned in the upper interior region of the chamber.

There are various ways in which the fluid handling system 26 can be configured. For example, as shown in FIGS. 1A and 1B, a window 16 may be formed in the lower interior region 12b and one or more manifolds may be moveable into place at the window 16 to direct process fluids into the chamber 10. The manifolds and the window 16 are preferably sealed within a containment vessel 26, a sealed housing that exhausts fumes, gases etc. that may be released from the manifolds so as to prevent their escape into the surrounding environment.

A fluid manifold 18 is positionable to direct process fluids (e.g. chemistries for etching, and DI water for rinsing) into the lower interior 12a of chamber 10 via window 16. Fluid manifold 18 includes at least one, but preferably multiple, openings 20 through which fluid is directed into the chamber 10. The fluid manifold 18 is moveable between a closed position (FIG. 1A) in which the manifold is oriented to direct fluids into the window 16 via openings 20, and an open position (FIG. 1B) in which the openings 20 are positioned away from the window 16. The fluid manifold 18 may be moveable between the closed and open positions using standard automation. Fluid manifold 18 may optionally include a megasonic transducer (not shown) having one or more transducers for directing megasonic energy into fluids in the chamber as will be described in greater detail below. For simplicity, the term "megasonic transducer" will be used herein to encompass transducer assemblies comprised of a single transducer or an array of multiple transducers.

A second fluid manifold, which will be referred to as the megasonics manifold 22, is provided and includes one or more inlets 24. Like the fluid manifold 18, the megasonics manifold 22 is moveable between a closed position (FIG. 1B) in which the inlets 24 are oriented to direct fluid (e.g. cleaning solutions and DI water for rinsing) from the megasonics manifold 22 through window 16, and an opened position (FIG. 1A) in which the inlets 24 are spaced from the window 16, permitting the manifold 18 to be brought into its closed position. The megasonics manifold 22 may be moveable between the closed and open positions.

The megasonics manifold 22 includes a megasonic transducer, which may include a single transducer or an array of multiple transducers, oriented to direct megasonic energy into the chamber interior via the window. When the megasonic transducer(s) direct megasonic energy into fluid in the chamber, they induce acoustic streaming within the fluid—i.e. streams of microbubbles that aid in removal of contaminants from the substrate and that keep particles in motion within the process fluid so as to avoid their reattachment to the substrate.

Figure 1C:
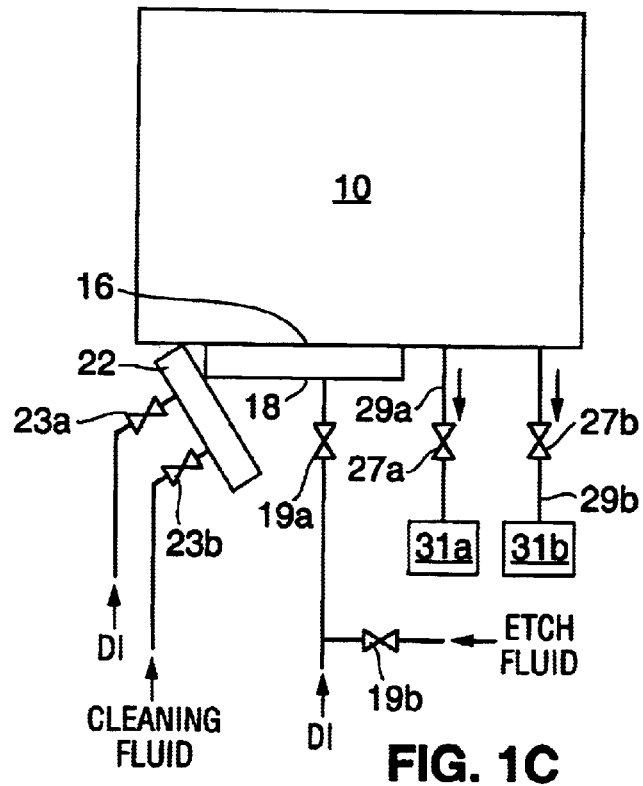
FIG. 1C is a block diagram illustrating one example of a fluid handling system useable with the chamber of FIG. 1A.

Referring to the block diagram of FIG. 1C, the fluid handling system 26 may include a system of valves and conduits for directing fluids into the manifolds 18, 22. A DI water source and a source of etch fluid are fluidly coupled to manifold 18, and valves 19a, 19b govern flow of these fluids into the manifold 18. It should be appreciated that while the etch plumbing is shown configured for injection into a DI water stream, etch fluid may alternatively be independently directed into the manifold 18. Similarly, valves 23a, 23b and associated conduits couple sources of DI water and cleaning fluid to megasonics manifold 22.

The configuration of the fluid handling system shown in FIG. 1C provides two means for evacuation of fluid from the chamber 10. First, dedicated sealed containers 31a, 31b are provided for rapidly withdrawing fluids from the chamber. Preferably, each sealed container is dedicated to a particular type of process fluid, e.g. an etch fluid or a cleaning fluid, so as to prevent cross-contamination of process fluids.

Each container 31a, 31b is coupled to the chamber 10 by valves 27a, 27b and associated drain plumbing 29a, 29b. Alternatively, the valves and drain plumbing may couple the sealed containers 31a, 31b to the manifolds 18, 22 (not shown). The sealed containers 31a, 31b are maintained at negative pressure and the valves 27a, 27b are kept closed except when they are opened for evacuation of the chamber. At the end of the etch process, the valve 27a may be opened, causing rapid removal of the etch fluid into the negative pressure container 31a for subsequent re-use. This rapid removal of the fluid helps to shear etch solution from the substrate surface. It also optimizes uniformity across the substrate surface by creating a sharp transition between exposure of the substrate to the etch solution and separation of the substrate from the bulk etch solution—thus minimizing surface variations between the top portion of the substrate and the lower portion of the substrate. This transition may be sharpened further, and the shearing of the etch solution from the substrate may be enhanced, by using the end effector to pull the substrate into the upper interior region 12b during the rapid fluid removal.

The second evacuation means provided in the embodiment of FIG. 1C utilizes the megasonics manifolds 18, 22, which are moved to the opened position to dump fluid from the chamber into a drain (not shown).

Figure 1D:
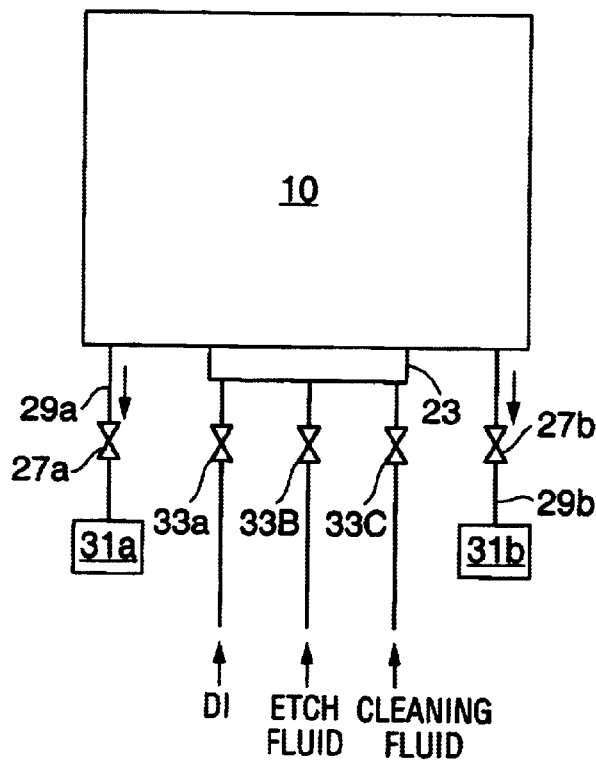
FIG. 1D is a block diagram illustrating a second example of a fluid handling system useable with the chamber of FIG. 1A.

As another example of a fluid distribution system, a fluid manifold 23 as shown in the block diagram of FIG. 1D may be provided with multiple dedicated valves 33a, 33b, and 33c feeding process fluids into the manifold 23. In such a configuration, one valve may feed etch solution into the manifold, whereas another may feed cleaning solution and another may feed rinse water. This type of dedicated configuration is desirable in that it minimizes the number of common plumbing components (i.e. those that are exposed to multiple process chemicals) and thus minimizes the amount of rinsing required for the plumbing between process steps.

In this example, manifold 23 may include a megasonic transducer, or a megasonic transducer may be positioned in a lower region of the chamber 10. The manifold 23 may be fixed or moveable to an opened position for a rapid evacuation of the chamber 10. Sealed negative pressure containers 31a, 31b may also provide an additional means of evacuation as described with respect to the FIG. 1C embodiment. The sealed containers 31a, 31b may be coupled to the manifold itself, or to the chamber 10 as shown in FIG. 1D.

Upper Megasonics

Referring again to FIGS. 1A and 1B, an overflow weir 34 is formed along the chamber periphery at the top of the lower interior region 12a. Process fluid flowing into the chamber from manifolds 18, 22 cascades into the weir 34 and into overflow plumbing 35 for recirculation or disposal. A pair of megasonic transducers 32a, 32b, each of which may include a single transducer or an array of multiple transducers, are positioned at an elevation below that of the weir 34, and are oriented to direct megasonic energy into an upper portion of lower interior region 12a of the chamber 10. Transducer 32a directs megasonic energy towards the front surface of a substrate, while transducer 32b directs megasonic energy towards the rear surface of the substrate.

The transducers are preferably positioned such that the energy beam interacts with the substrate surface at or just below the gas/liquid interface, e.g. at a level within the top 0–20% of the liquid in the lower interior 12a. The transducers may be configured to direct megasonic energy in a direction normal to the substrate surface or at an angle from normal. Preferably, energy is directed at an angle of approximately 0–30 degrees from normal, and most preferably approximately 5–30 degrees from normal. Directing the megasonic energy from transducers 32a,b at an angle from normal to the substrate surface can have several advantages. For example, directing the energy towards the substrate at an angle minimizes interference between the emitted energy and return waves of energy reflected off the substrate surface, thus allowing power transfer to the solution to be maximized. It also allows greater control over the power delivered to the solution. It has been found that when the transducers are parallel to the substrate surface, the power delivered to the solution is highly sensitive to variations in the distance between the substrate surface and the transducer. Angling the transducers reduces this sensitivity and thus allows the power level to be tuned more accurately. The angled transducers are further beneficial in that their energy tends to break up the meniscus of fluid extending between the substrate and the bulk fluid (particularly when the substrate is drawn upwardly through the band of energy emitted by the transducers)—thus preventing particle movement towards the substrate surface.

Additionally, directing megasonic energy at an angle to the substrate surface creates a velocity vector towards overflow weir 34, which helps to move particles away from the substrate and into the weir. For substrates having fine features, however, the angle at which the energy propagates towards the substrate front surface must be selected so as to minimize the chance that side forces imparted by the megasonic energy will damage fine structures.

It may be desirable to provide the transducers 32a, 32b to be independently adjustable in terms of angle relative to normal and/or power. For example, if angled megasonic energy is directed by transducer 32a towards the substrate front surface, it may be desirable to have the energy from transducer 32b propagate towards the back surface at a direction normal to the substrate surface. Doing so can prevent breakage of features on the front surface by countering the forces imparted against the front surface by the angled energy. Moreover, while a relatively lower power or no power may be desirable against the substrate front surface so as to avoid damage to fine features, a higher power may be transmitted against the back surface (at an angle or in a direction normal to the substrate). The higher power can resonate through the substrate and enhance microcavitation in the trenches on the substrate front—thereby helping to flush impurities from the trench cavities.

Additionally, providing the transducers 32a, 32b to have an adjustable angle permits the angle to be changed depending on the nature of the substrate (e.g. fine features) and also depending on the process step being carried out. For example, it may be desirable to have one or both of the transducers 32a, 32b propagate energy at an angle to the substrate during the cleaning step, and then normal to the substrate surface during the drying step (see below). In some instances it may also be desirable to have a single transducer, or more than two transducers, rather than the pair of transducers 32a, 32b.

Vapor inlet ports 36, fluid applicators 37, and gas manifold 38 extend into upper interior region 12b of the chamber 10. Each is fluidly coupled to a system of conduits that deliver the appropriate vapors and gases to the ports as needed during processing. The fluid applicators 37 are preferably configured to inject a stream or streams of process fluid into the upper interior region 12b. It is preferable that the stream(s) of injected fluid collectively extend for a width at least as wide as the diameter of the substrate, such that fluid may be uniformly applied at high velocity across the width of the substrate as the substrate is moved past the stream(s). To this end, the fluid applicators may comprise a pair of narrow elongate slots in the wall of the upper region 12b of the chamber. It is also preferable that the fluid applicators 37 are spaced from the substrate by a very close distance.

First Embodiment—Operation

The system 2 may be used for various processes, including those requiring one or more of the steps of wet etching, cleaning, rinsing and drying. Its use will be described in the context of an etch, clean and drying process, in which rinses are performed following etching and cleaning. Performance of this combination of steps is efficient in that it allows multiple steps to be performed in a single chamber, and it minimizes post-treatment particle reattachment since substrates leave the chamber dry. Moreover, performance of the multiple steps in a single chamber minimizes buildup of particles and residue in the process chamber, since each time a substrate goes through the sequence of processes, the chamber itself is cleaned and dried. Naturally, various other combinations of these or other process steps may be performed without departing from the scope of the present invention.

Etching

If processing is to begin with an etch procedure, operation of the first embodiment begins with fluid manifold 18 in the closed position as shown in FIG. 1A. The lower portion 12a of the chamber 10 is filled with process fluids necessary for the etching procedure (for example, hydrofluoric acid (HF), ammonium fluoride and HF, or buffered oxide). These fluids may be injected into a DI water stream entering fluid manifold 18 (using, for example, the fluid handling configuration shown in FIG. 1C), causing them to flow into the chamber 10 with the DI water. Alternatively, the etch solution may flow directly into manifold 18 and into chamber, or, if the fluid handling configuration of FIG. 1D is used, the solution may enter manifold 23 and chamber 10 via dedicated valve 33b. In either case, the solution cascading over weir 34 may be recirculated back into the chamber 10 throughout the etch process, such as by collecting it into a (preferably) temperature-controlled vessel and circulating it back to manifold 18 for re-introduction into the chamber 10. Alternatively, the etch process may be a "one-pass" process in which the overflowing etch solution is directed to a drain for disposal. As a third alternative, the flow of etch solution may be terminated once the lower portion 12a of the chamber has been filled.

Substrate S is engaged by end effector 30 and moved into the etch solution by the substrate transport device 28. Substrate S is positioned in the lower portion 12a of the chamber, i.e. at an elevation below that of the weir 34, so that the substrate is fully immersed in the etch solution.

In wet processing, a relatively stagnant fluid layer known as a "boundary layer" is typically present at the substrate surface. A thick boundary layer can inhibit the ability of an etch or cleaning solution to reach and react with the substances that are to be removed from the substrate surface. It is thus desirable to minimize the thickness of the boundary layer of fluid attached to the substrate surface so that the etch chemicals can more effectively contact the substrate surface. Boundary layer thinning may be accomplished by inducing turbulence in the etch fluid using disturbances formed into the sidewalls of the chamber. For example, a random or patterned topography may be machined into the side walls so that fluid flowing through the chamber 10 from the manifold is turbulent rather than laminar. Turbulence may be further increased by using relatively high fluid flow rates and temperatures. As another alternative, additional inlet ports (not shown) may be formed into the side walls and process fluids may enter the chamber via these ports as well as via manifold 18 so as to cause disruptions in the flow from the manifold 18. As yet another alternative, a megasonic transducer of a type that could withstand the etch fluids (e.g. sapphire, fluoroplastic, PFA, Halar, ECTFE, coated metal, or polytetrafluoroethylene (PTFE) sold under the trade name Teflon) could be positioned in the chamber 10 to cause turbulent flow of the etch fluid and to thus induce or contribute to boundary layer thinning.

Post-Etch Quench and Rinse

At the end of the etch procedure, flow of etch solution is terminated and a post-etch rinsing step may be carried out to remove etch solution from the substrate and chamber. The post-etch rinsing step may be initiated in one of several ways. In one example, manifold 18 is moved to the opened position (FIG. 1B), draining the etch solution from the chamber 10 into a drain (not shown), from which it is directed for collection/disposal. The manifold is then closed and DI rinse water is introduced into the chamber via fluid manifold 18 and caused to cascade through the chamber and over weir 34. Alternatively, the step of opening the manifold 18 may be eliminated, in which case flow of DI water is permitted to continue until the etch solution is thoroughly rinsed from the substrate, manifold and chamber.

As another alternative, the etch fluid may be rapidly removed from chamber 10 by opening valve 27a (FIG. 1C), causing the fluid to be suctioned into sealed negative pressure container 31a for later re-use or disposal. As discussed in the "Structure" section above, this type of rapid removal of etch solution minimizes etch variations across the substrate surface by more sharply ending the exposure of the substrate to the bulk etch fluid. This process is preferably enhanced by simultaneously using the end effector 30 to withdraw the substrate from the chamber lower portion 12a into the upper portion 12b. Withdrawal may be carried at any desired speed, although a rate of 25–300 mm/sec has been found beneficial.

The post-etch rinse process may preferably include a boundary layer thinning process to accelerate diffusion of the etch chemistry from the surface of the substrate out of the boundary layer of fluid attached to the substrate and into the surrounding bulk fluid. This diffusion process is known in the art as "quenching" and is instrumental in terminating etching of the substrate surface. A megasonic transducer positioned at or near the chamber bottom (e.g. a transducer provided as part of fluid manifold 18, or a transducer mounted separately within the chamber, or the transducer of megasonics manifold 22) may also be utilized for this purpose.

The accelerated quench is preferably performed in combination with the rapid removal of the bulk etch fluid (e.g. in approximately less than 1.0 second), such as by suction of the fluid into the negative pressure container 31a (FIG. 1C) and the simultaneous withdrawal of the substrate into the upper portion 12b of the chamber. However, any of the evacuation processes described above, such as opening of the manifold 18, may also be used preferably in combination with the lifting of the substrate from the chamber 10.

Next, the chamber 10 is rapidly filled with a quenchant such as DI water. Since at this time the substrate is in the upper portion 12b of the chamber, rapid filling can be performed without concern that the substrate will be splashed—an occurrence which could lead to lack of uniformity across the substrate's surface. As the chamber 10 begins to fill, the megasonic transducer in the chamber bottom (i.e. depending on the fluid handling system, this may be the transducer of manifold 22, manifold 18, or a lower chamber transducer) is operated at low power. The megasonic power is increased as the chamber fills with DI water. Once the lower portion 12a of the chamber has been partially filled, the substrate is lowered into the quenchant. The turbulence created by the megasonic energy facilitates boundary layer thinning that thus facilitates diffusion of etch chemistry from the boundary layer into the bulk rinse water.

The megasonic power is increased as the volume of quenchant in the chamber increases. Beginning at a lower power and increasing the power as the chamber fills minimizes the chance of high power megasonic energy causing splashing of quenchant onto the substrate, and also minimizes the likelihood that residual etch solution on the substrate and in the tank would aggressively etch the bottom portion of the substrate immersed in the water.

The flow of DI water or other quenchant into the chamber preferably continues even after the substrate is fully immersed. The upper megasonic transducers 32a, 32b are energized. These transducers impart megasonic energy into an adjacent region of the DI water. The energy creates a zone Z (FIGS. 2A through 2C) in which the turbulence created by the megasonic energy causes boundary layer thinning and thus facilitates gettering of the etch material away from the substrate and into the quenchant. The zone Z is a band of megasonic energy extending across the chamber. The substrate transport 28 pulls the substrate through zone Z so as to expose the entire substrate to the zone Z. The area of the band is preferably selected such that when the substrate passes through the zone, up to 30% of the surface area of a face of the substrate is positioned within the band. Most preferably, as the center of the substrate passes through the zone, only approximately 3–30% of the surface area of a face of the substrate is positioned within the band.

The substrate is raised and lowered through zone Z one or more times as needed for a thorough quench. The raising and lowering may be performed at any desired speed, although a rate of approximately 25–300 mm/sec has been found to be beneficial. As the substrate passes from the upper region 12b into the bulk rinse fluid, particles entrained at the substrate surface are released at the gas/liquid interface and are flushed over the weir and out of the chamber. The expression "gas/liquid interface" as used herein refers to the interface between air present in the chamber (and/or gas or vapor introduced into the chamber) and fluid in the lower region 12a of the chamber. Preferably the zone Z is created slightly below the gas/liquid interface.

It should be noted that the lower megasonic transducer may remain powered on while the substrate is translated through the zone Z.

The quenching process may be enhanced by a stream of DI water preferably directed into upper region 12b through fluid applicators 37. As the substrate transport 28 pulls the substrate through the chamber, the substrate passes through zone Z and through the stream of fresh water. During movement of the substrate upwardly past the fluid stream, the fluid stream applies a thin layer of fresh rinse fluid to the portion of the substrate at which the boundary layer was just thinned by zone Z. The substrate may be moved upwardly and downwardly through the zone Z and the fluid stream one or more times as needed for a thorough quench.

The timing of energization of the transducers 32a, 32b may be selected depending on the goals of the process or the nature of the substrate surface (e.g. whether it is hydrophobic or hydrophilic). In some instances it may be desirable to energize the transducers 32a, 32b only during extraction of the substrate from lower region 12a into upper region 12b, or only during insertion of the substrate into lower region 12a, or during both extraction and insertion.

After quenching, DI water may continue to circulate through the chamber until such time as the chamber, end effectors and substrate have been thoroughly rinsed.

Cleaning

A substrate cleaning step may also be performed utilizing the first embodiment. If etching is performed, the cleaning step may occur before and/or after the etch process. Prior to cleaning, the chamber is drained by moving the fluid manifold 18 away from the window 16. If the fluid handling configuration of FIG. 1C is used, the megasonics manifold 22 is moved to the closed position covering the opening. During the cleaning process, a cleaning solution (for example, a solution of water, $NH_2OH$ and $H_2O_2$ that is known in the industry as "SC1") is introduced into the chamber 10 via megasonics manifold 22 and caused to cascade over weir 34. Alternatively, if a fluid handling configuration such as that shown in FIG. 1D is used, the cleaning solution enters the manifold 23 and chamber 10 via the appropriate one of the dedicated valves 33c.

Megasonic transducers 32a,b are energized during cleaning so as to impart megasonic energy into an adjacent region of the process fluid—and in doing so create zone Z (FIGS. 2A through 2C) of optimum performance within the chamber. If necessary to prevent fine feature damage, one of the transducers may by operated at low power or zero power.

Throughout cleaning, the substrate transport 28 moves the substrate upwardly and downwardly one or more times (as required by the specifics of the process) to move the entire substrate through the zone Z of optimum performance. The substrate may be translated through the zone at any desired speed, although a rate of approximately 25–300 mm/sec has been found beneficial.

As with the quenching process, the timing of energization of the transducers 32a, 32b may be selected depending on the goals of the process. In some instances it may be desirable to energize the transducers 32a, 32b only during extraction of the substrate from lower region 12a into upper region 12b, or only during insertion of the substrate into lower region 12a, or during both extraction and insertion.

The zone Z is a band of megasonic energy extending across the chamber, preferably slightly below the gas/liquid interface. The substrate transport 28 pulls the substrate through the band so as to expose the entire substrate to the zone Z. The area of the band is preferably selected such that when the substrate passes through the zone, up to 30% of the surface area of a face of the substrate is positioned within the band. Most preferably, as the center of the substrate passes through the zone, only approximately 3–30% of the surface area of a face of the substrate is positioned within the band.

Creation of zone Z is optimal for cleaning for a number of reasons. First, cleaning efficiency is enhanced by minimizing the thickness of the boundary layer of fluid that attaches to the substrate surface—so that the cleaning solution can more effectively contact the substrate surface and so that reaction byproducts can desorb. The megasonic energy from transducers 32a, 32b thin the boundary layer by creating regional turbulence adjacent the substrate. Since transducers 32a, 32b are directed towards the front and back surfaces of the substrate, this boundary layer thinning occurs on the front and back surfaces. The megasonic energy further causes microcavitation within the fluid, i.e. formation of microbubbles that subsequently implode, releasing energy that dislodges particles from the substrate. The megasonic turbulence keeps particles in the fluid suspended in the bulk and less likely to be drawn into contact with the substrate. Lastly, high velocity fluid flow through the chamber and over the weir moves particles away from the zone and thus minimizes re-attachment. This high velocity flow may be enhanced as discussed using a narrowed throat region in the upper end of the chamber, or using an active mechanism such as a bellows-type device, to accelerate fluid flow through the zone.

Further optimization of cleaning at zone Z may be achieved by introducing a gas such as nitrogen, oxygen, helium or argon into upper interior region 12b via gas inlet port 38. The gas diffuses into the volume of cleaning solution that is near the surface of the cleaning solution and increases the microcavitation effect of the megasonic transducers in the zone Z of optimal performance.

The lower megasonic transducer associated with manifold 22 (or, in the case of the FIG. 1D embodiment, a megasonic transducer associated with manifold 23 or separately positioned in the lower portion of the chamber) may be activated during the cleaning process, to as to create an acoustic streaming effect within the chamber, in which streams of microbubbles are formed that keep liberated particles suspended in the bulk fluid until they are flushed over the weir 34, so as to minimize particle re-attachment to the substrate. It has been found to be desirable, but not required, to operate the lower megasonic transducer while the upper megasonic transducers 32 are also activated and while the substrate is being translated through the zone Z.

It should be noted that while some minimal boundary layer thinning may be caused by activation of the lower transducer(s), boundary layer thinning is not the objective of activation of the megasonics associated with this transducer. Creating the zone Z in which the boundary layer is thinned as described above, rather than relying upon acoustic streaming procedures for boundary layer thinning of the entire substrate surface, is advantageous in that by keeping the boundary layer relatively thicker outside the zone, the chance of particle reattachment is minimized.

To further minimize the chance of particle reattachment, a particle gettering surface (not shown) may be positioned in the chamber near zone Z. During cleaning, a charge is induced on the gettering surface such that particles liberated from the substrate surface are drawn to the gettering surface and thus away from the substrate. After the substrate has passed out of zone Z, the polarity of the gettering surface is reversed, causing release of particles from the gettering surface. These released particles are flushed out of the chamber 10 and into the weir by the flowing cleaning fluid.

A charge may also be induced on the end effector 30 so as to draw particles off of the substrate when the end effector is in contact with the substrate. Later, the polarity of the end effector is reversed, causing particles gettered into the end effector to be released into the flowing cleaning fluid in the chamber and to be flushed into the weir.

The cleaning process will result in release of gases from the cleaning solution into the upper interior region 12b, some of which may contact exposed regions of the substrate and cause pitting at the substrate surface. To avoid such exposure, select vapors are introduced into the upper chamber region 12b via vapor inlet port 36. The vapors condense on the substrate to form a protective film. If any released gas should condense on the substrate, it will react with the protective film rather than reacting with the silicon surface of the substrate. For example, an SC1 cleaning solution will cause off gassing of ammonia into the chamber. In this example, hydrogen peroxide vapor would be introduced into the upper region 12b to form a protective film on the substrate. Ammonia released by the cleaning solution will react with the protective film rather than pitting the substrate surface.

After the substrate has been exposed to cleaning solution for the required process time, the substrate is rinsed using a rinse solution. The rinse solution naturally will be dependent on the cleaning process being carried out. Following back end of the line (BEOL) cleaning, an isopropyl alcohol or dilute acid rinse may be carried out. After front end cleaning process such as SC1 cleaning, a DI water rinse is preferable. Rinsing may be accomplished in various ways. For example, with the substrate preferably elevated above the cleaning solution in the chamber, the cleaning solution may be suctioned back through the manifold 22 into a low pressure container 31b in the manner described in connection with the etch process. Next, rinse fluid is introduced into the chamber 10 (via, for example, manifold 22 of FIG. 1C, manifold 23 of FIG. 1D) and cascades over the weir 34.

The substrate is lowered into the rinse water and the water rinses the cleaning solution from the chamber 10 and from the surface of the substrate. Alternatively, with the substrate remaining in the cleaning solution, rinse fluid may be introduced into the lower region chamber, thereby flushing the cleaning solution from the chamber 10 into the weir 34 as it rinses the chamber and substrate.

Megasonic energy from the side transducers 32a, 32b and/or the lower transducer is optionally directed into the rinse water chamber so as to enhance the rinse process. The substrate may be passed through zone Z multiple times (again at a rate that may, but need not be, within the range of 25–300 mm/sec) as needed for thorough rinsing. A gas such as nitrogen, oxygen, helium or argon may be introduced into upper interior region 12b via gas inlet port 38. The gas diffuses into the volume of rinse fluid that is near the gas/liquid interface (i.e. the interface between the upper surface of the rinse fluid and the gas or air above it) and surface of the rinse fluid and increases the microcavitation effect of the megasonic transducers in zone Z.

The power state of the transducers is selected as appropriate for the stage of the rinsing process and the surface state of the substrate. Preferably, both of the side transducers 32a, 32b and the lower transducer are powered "on" during insertion of the substrate into the rinse fluid. Depending upon the surface state of the substrate (e.g. whether it is hydrophilic or hydrophobic), the side transducers 32a, 32b may be on or off during extraction of the substrate into the upper region 12b.

Reactive Gas Rinse

At some point during wet processing, the substrate may be exposed to a reactive gas (such as, for example, ozone, chlorine or ammonia) so as to interact with the substrate surface. Preferably, the reactive gas is dissolved in a rinse fluid and the substrate is exposed to the rinse fluid for an appropriate length of time.

The reactive gas rinse may be carried out with megasonic energy being used to create a turbulent flow of the reactive gas rinse fluid. The turbulent flow thins the boundary layer of fluid attached to the substrate, so as to enhance reactive gas diffusion through the boundary layer into contact with the substrate surface. Turbulence may be created using a megasonic transducer positioned in the bottom of the chamber as reactive gas rinse fluid flows into the chamber via one of the fluid manifolds. Alternatively, reactive gas may be introduced, via nozzles 36 or additional nozzles, into the upper interior 12b of the chamber as rinse water flows into the chamber via one of the fluid manifolds. The gas dissolves into the rinse water near the surface of the rinse water. The upper megasonic transducers 32a, 32b are energized to cause boundary layer thinning in zone Z, creating a zone of optimal absorption of reactive species onto the substrate surface. The substrate is translated through the zone Z one or more times as needed for the reactive gas to effectively treat the substrate surface.

Pre-Dry Rinse

In certain processes it may be desirable to perform a pre-dry passivating rinse using hydrofluoric acid (HF), hydrochloric acid (HCI) or de-gassed DI water.

In such processes, the lower portion 12a of the chamber 10 is filled with passivation fluid. The passivation fluid may be injected into a DI water stream entering fluid manifold 18 (using, for example, the fluid handling configuration shown in FIG. 1C), causing it to flow into the chamber 10 with the DI water. Alternatively, the passivation fluid may flow directly into manifold 18 and into chamber, or, if the fluid handling configuration of FIG. 1D is used, the fluid may enter manifold 23 and chamber 10 via dedicated valve 33b. In either case, the solution cascading over weir 34 may be recirculated back into the chamber 10 throughout the pre-dry rinse process, such as by collecting it into a (preferably) temperature-controlled vessel and circulating it back to manifold 18 for re-introduction into the chamber 10. Alternatively, the pre-dry rinse process may be a "one-pass" process in which the overflowing fluid is directed to a drain for disposal. As a third alternative, the flow of fluid may be terminated once the lower portion 12a of the chamber has been filled.

Substrate S is engaged by end effector 30 and moved into the solution by the substrate transport device 28. Substrate S is positioned in the lower portion 12a of the chamber, i.e. at an elevation below that of the weir 34, so that the substrate is fully immersed in the passivation solution. As with the reactive gas step, the upper megasonic transducers 32a, 32b may be energized to cause boundary layer thinning in zone Z, creating an optimal zone for contact between the passivating rinse fluid and the substrate surface. The substrate is translated through the zone Z one or more times as needed for the passivating rinse fluid to effectively passivate the substrate surface. The use of megasonic energy may also prevent particle deposition onto the substrate, which can often occur using low-pH passivation solutions such as HF or HCI.

Drying

After the final treatment and rinse steps are carried out, the substrate is dried within the chamber. Drying may be performed in a number of ways—three of which will be described below. Each of the three examples described utilize an IPA vapor preferably carried into the chamber by a nitrogen gas flow. In each example, the IPA vapor is preferably generated in an IPA generation chamber remote from the chamber 10, using one of a variety of IPA generation procedures known those skilled in the art. For example, IPA vapor may be created within the IPA generation chamber by injecting a pre-measured quantity of IPA liquid onto a heated surface within the IPA generation chamber. The IPA is heated on the heated surface to a temperature preferably less than the boiling point of IPA (which is 82.4° C. at 1 atmosphere). Heating the IPA increases the rate at which IPA vapor is generated and thus expedites the process, creating an IPA vapor cloud. When the IPA vapor is needed in the chamber 10, nitrogen gas is passed through an inlet into the IPA generation chamber, and carries the IPA vapor out of the IPA generation chamber via an outlet that is fluidly coupled to the vapor inlet port 36 in chamber 10.

The three examples of drying processes using the IPA vapor will next be described. In one embodiment, the bulk water used for the final rinse may be rapidly discharged from the chamber 10 by rapidly withdrawing the fluid into a negative pressure container, or by performing a "quick dump" by moving megasonics manifold 22 to the opened position (or, if drying follows an HF last process and rinse, fluid manifold 18 is moved from the closed to opened position). Then a vapor of isopropyl alcohol is introduced into the chamber 10 via vapor inlet port 36. The IPA vapor passes into the lower portion 12a of the chamber and condenses on the surface of the substrate where it reduces the surface tension of the water attached to the substrate, and thus causes the water to sheet off of the substrate surfaces. Any remaining liquid droplets may be evaporated from the substrate surface using gas, such as heated nitrogen gas, introduced through gas inlet port 38. Gas inlet port 38 may include a gas manifold having outlets that are angled downwardly. The end effector 30 may be used to move the substrate past this manifold to accelerate evaporation of remaining PA/water film from the surface of the substrate.

In an alternative drying process, an atmosphere of IPA vapor may be formed in the upper interior region 12b by introducing the vapor via vapor inlet port 36. According to this embodiment, the substrate transport 28 lifts the substrate from the lower interior region 12a into the IPA atmosphere in the upper interior region 12b, where the IPA vapor condenses on the surface of the substrate, causing the surface tension of the water attached to the substrate to be reduced, and thus causing the water to sheet from the substrate surface.

The megasonic transducers 32a, 32b may be energized as the substrate is pulled from the DI water so as to create turbulence in zone Z to thin the boundary layer of fluid attached to the substrate. With the boundary thinned by zone Z, IPA can diffuse more quickly onto the surface of the substrate, thus leading to faster drying with less IPA usage. Thus, the substrate may be withdrawn into the IPA atmosphere relatively quickly, i.e. preferably at a rate of 30 mm/sec or less, and most preferably at a rate of between approximately 8 mm/sec–30 mm/sec. This is on the order of ten times faster than prior extraction drying methods, which utilize a slow withdrawal (e.g. 0.25 to 5 mm/sec) to facilitate a surface-tension gradient between fluid attached to the substrate and the bulk rinse water.

Again, gas such as heated nitrogen may be introduced via manifold 38 to evaporate any remaining IPA and/or water film, and the substrate may be translated past the manifold 38 to accelerate this evaporation process.

In a third alternative embodiment, slow extraction-type drying may be utilized. The substrate may thus be slowly drawn from the bulk DI water into the IPA vapor. Using this embodiment, the IPA condenses on the liquid meniscus extending between the substrate and the bulk liquid. This results in a concentration gradient of IPA in the meniscus, and results in so-called Marangoni flow of liquid from the substrate surface. Gas such as heated nitrogen gas may be directed from manifold 38 onto the substrate to remove some of the residual water and/or IPA droplets and/or film. The substrate may be moved past gas manifold 38 to accelerate this evaporation step.

In each of the above three embodiments, care should be taken to maintain the static pressure within the chamber during the various steps in the drying processes.

Second Embodiment—Structure

Figure 3A:
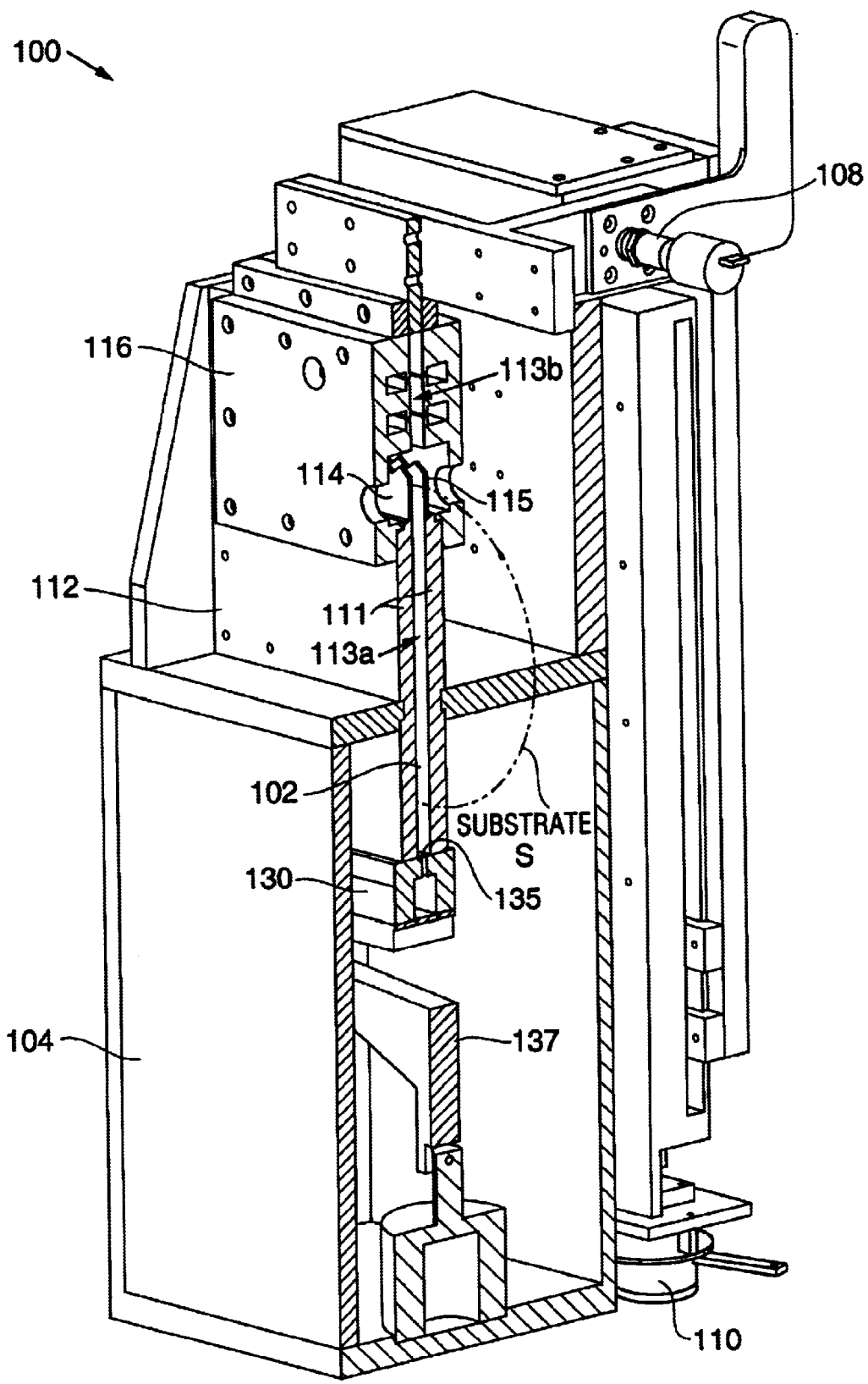
FIG. 3A is a cross-sectional perspective view of a second embodiment of a single substrate processing chamber showing the fluid manifold in the closed position. The figure also shows automation provided for transporting a substrate into, out of, and within the chamber.

FIG. 3A shows a second embodiment 100 of a single substrate processing chamber utilizing principles of the present invention.

Second embodiment 100 generally includes a process chamber 102, a containment vessel 104, an end effector 106, a rotational actuator 108 and a vertical actuator 110.

Figure 3B:
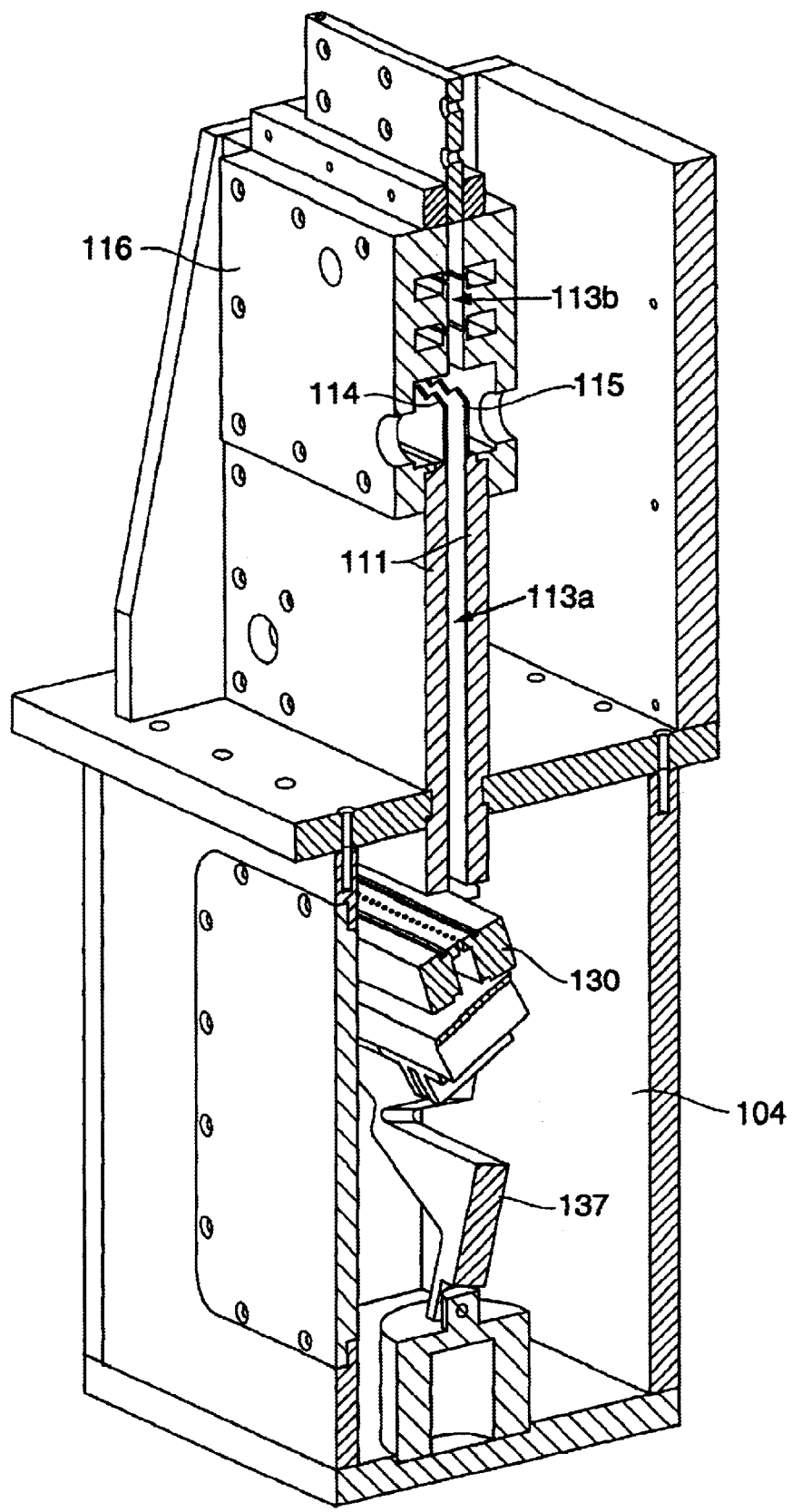
FIG. 3B is a cross-sectional perspective view of the single substrate processing chamber of FIG. 3A showing the fluid manifold in the opened position. The transport automation shown in FIG. 3A is not shown in FIG. 3B.
Figure 4:
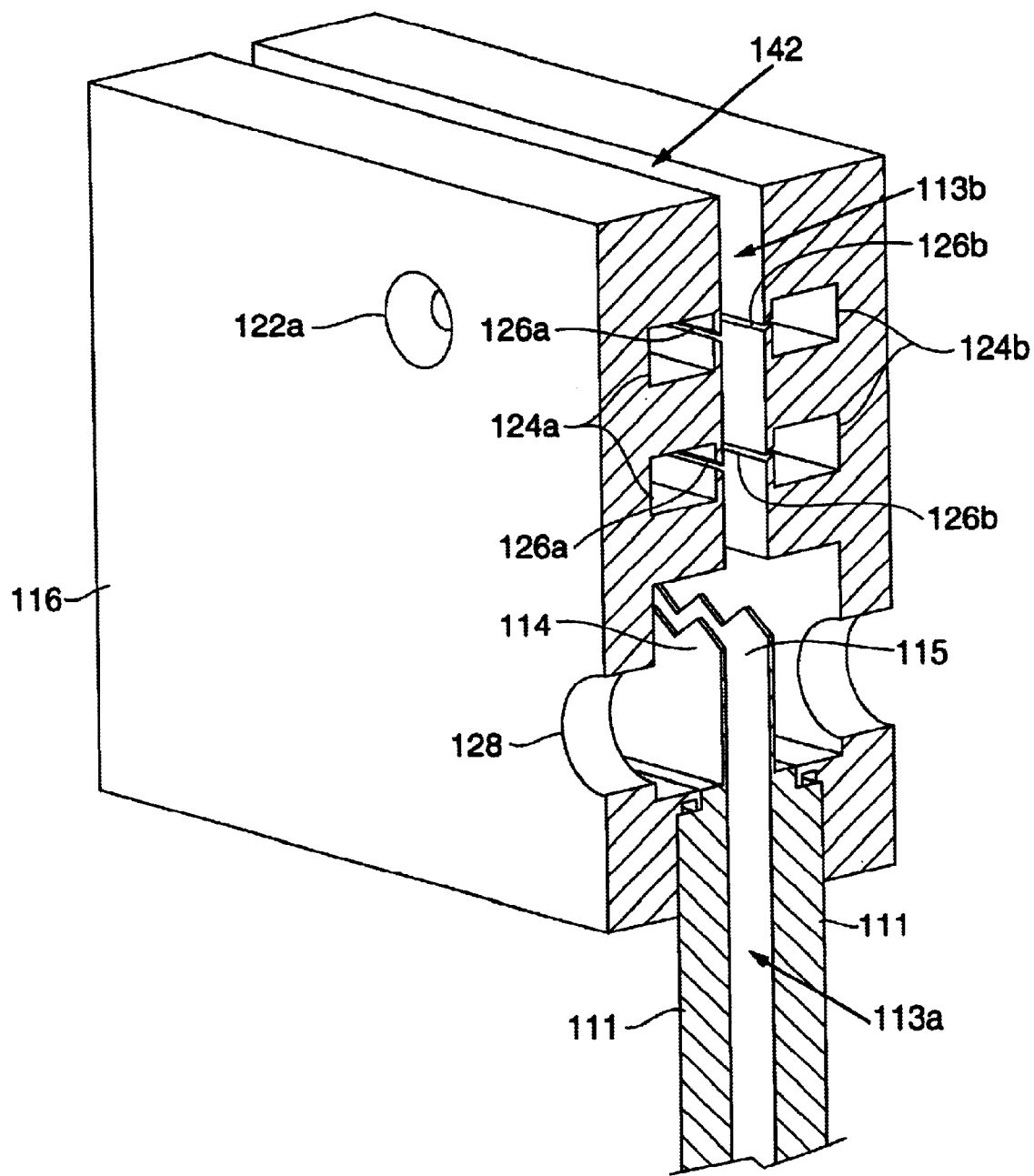
FIG. 4 is a cross-sectional perspective view of the upper manifold and a portion of the tank of the second embodiment of FIG. 3A.

Referring to FIG. 3A, process chamber 102 includes closely spaced chamber walls 111 defining a lower interior region 113a and an upper interior region 113b. An overflow weir 114 is positioned in the lower region 113a, slightly below upper region 113b. Overflow weir 114 includes a wall section 115 over which fluids cascade into the weir 114 during certain processing steps. At the bottom of the chamber 102 is a lower opening 135 (FIG. 3B), and at the top of the chamber is an upper opening 142 (FIG. 4).

A vapor/gas manifold 116 is provided for directing vapors/gases into upper region 113b of the chamber. Manifold 116 (best shown in FIG. 4) includes walls 120 on opposite sides of upper region 113b. Vapor/gas ports 122a, 122b extend through walls 120 and are fluidly coupled to vapor/gas conduits 124a, 124b. A plurality of orifices 126a, 126b extend from conduits 124a, 124b into the chamber 102. The orifices 126a, 126b may be downwardly angled as shown. The angles are preferably (but are not required to be) within the range of 45°–80° relative to the normal to walls 120. Each port 122a, 122b is coupled to plumbing that delivers process vapors/gases through the ports 122a,b and into chamber 102 via conduits 124a, b and orifices 126a, 126b.

Figure 5:
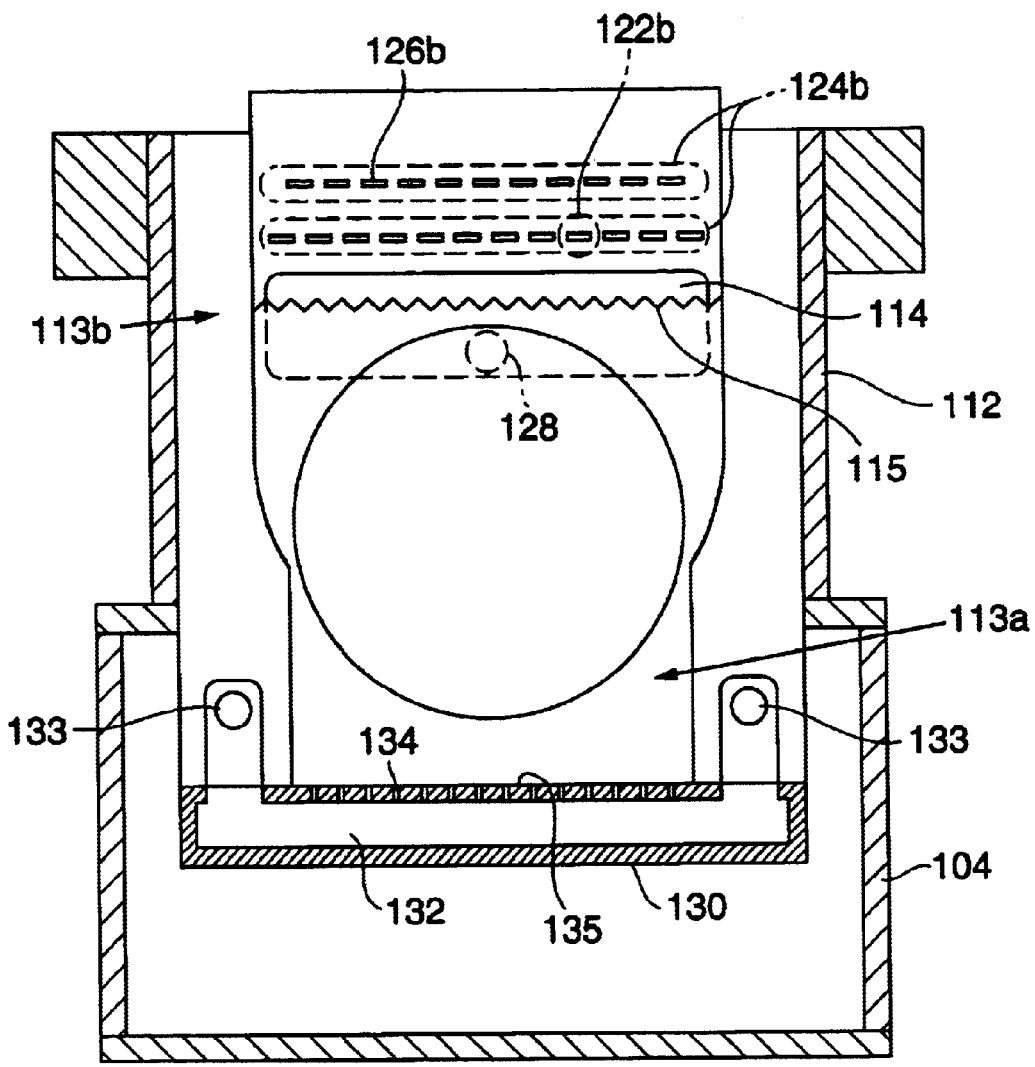
FIG. 5 is a cross-sectional side view of the second embodiment of FIG. 3A.

Referring to FIG. 5, manifold 116 additionally includes drain ports 128 extending from overflow weirs 114. Drain ports 128 are fluidly coupled to plumbing (not shown) that carries overflow fluids from weir 114 and away from the chamber for recirculation or disposal.

Within containment vessel 104 is a fluid manifold 130, which includes an elongated conduit 132, and a plurality of openings 134 extending from conduit 132 into the lower region of the chamber 102. Fluid ports 133 are coupled to conduit 132 and are fluidly coupled to a network of plumbing. This plumbing network selectively delivers a selection of different process chemistries through the fluid ports 133 into manifold 130 and thus into the chamber 102. Manifold 130 is moveable to an opened position as shown in FIG. 3B to permit fluid in the chamber to be rapidly discharged through lower opening 135 into a drain (not shown). Automation 137 is provided for moving the fluid manifold between the open and closed position.

Figure 6:
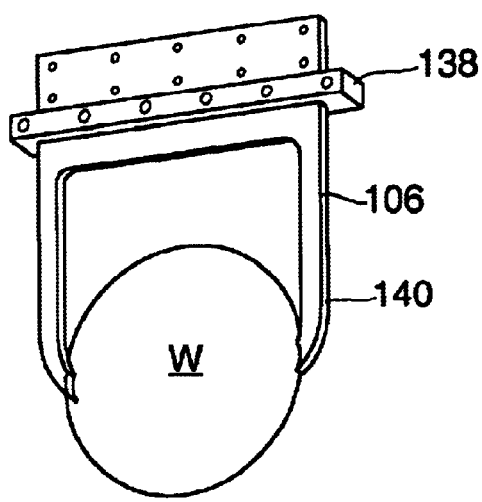
FIG. 6 is a perspective view of an end effector of the second embodiment of FIG. 3A. The end effector is shown carrying a substrate.

An end effector of the type shown in FIG. 6 may be used for either of the first or second embodiments. End effector 136 includes a block 138 and a pair of gripping members 140 that engage a substrate S between them by engaging opposite edges of the substrate as shown. Vertical actuator 110 (FIG. 3A) moves block 138 and gripping members 140 between a withdrawn position in which the substrate S is fully removed from the chamber 102, and an advanced position in which the substrate S is fully disposed within the lower region 113a. When in the advanced position, block 138 closes against opening 142 (FIG. 4) of chamber 102 so as to contain gases and vapors and so as to prevent migration of particles into the chamber.

When the end effector is in the withdrawn position, rotational actuator 108 (FIG. 3A) is configured to rotate the end effector to a lateral orientation. This is particularly desirable for large substrates (e.g. 300 mm) that are customarily housed in a horizontal arrangement in a storage device or carrier. The end effector can be made to retrieve and deposit substrates directly from/to such a carrier, or from a separate robotic end effector provided for unloading/loading substrates from/to the carrier. The vertical and horizontal actuators preferably utilize conventional robotics of the type known to those of skill in the art, and these as well as other automated features (e.g. those relating to measurement and injection of process fluids/vapors/gases are controlled by a conventional controller such as a PLC controller.

FIGS. 7A through 7E show an alternative end effector 106a having an engaging mechanism found particularly beneficial when used with the described embodiments. An alternative chamber 102a having a different shape than the chamber 102 is also described, although various other chamber shapes may be utilized with the end effector 106a. As will be understood from the description that follows, the end effector 106a has two positions relative to the substrate: a transport position in which the substrate is securely held by the end effector, and a process position in which the end effector stabilizes the substrate while permitting process fluids to flow into contact with the substrate's surface.

Figure 7A:
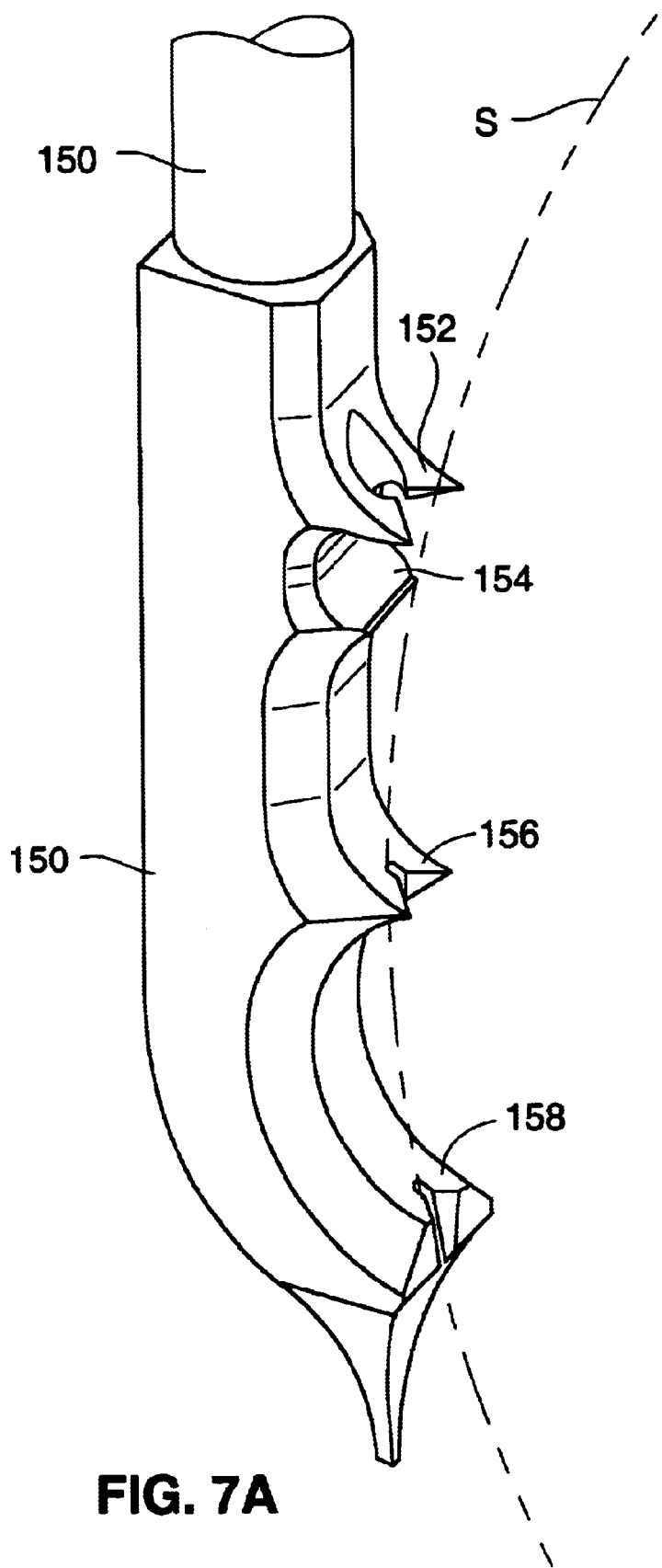
FIG. 7A is a perspective view of one prong of a second embodiment of an end effector during transport of a substrate.

Referring to FIG. 7A, the end effector 106a includes a pair of support members 150, each of which includes an upper support 152, lower support 154, upper transport slot 156 and lower transport slot 158. During transport of the substrate, upper and lower transport slots 156,158 receive the edge of the substrate S as shown in FIGS. 7A and 7B, thereby supporting the substrate as it is moved into/out of/within the chamber 102a.

Figure 7B:
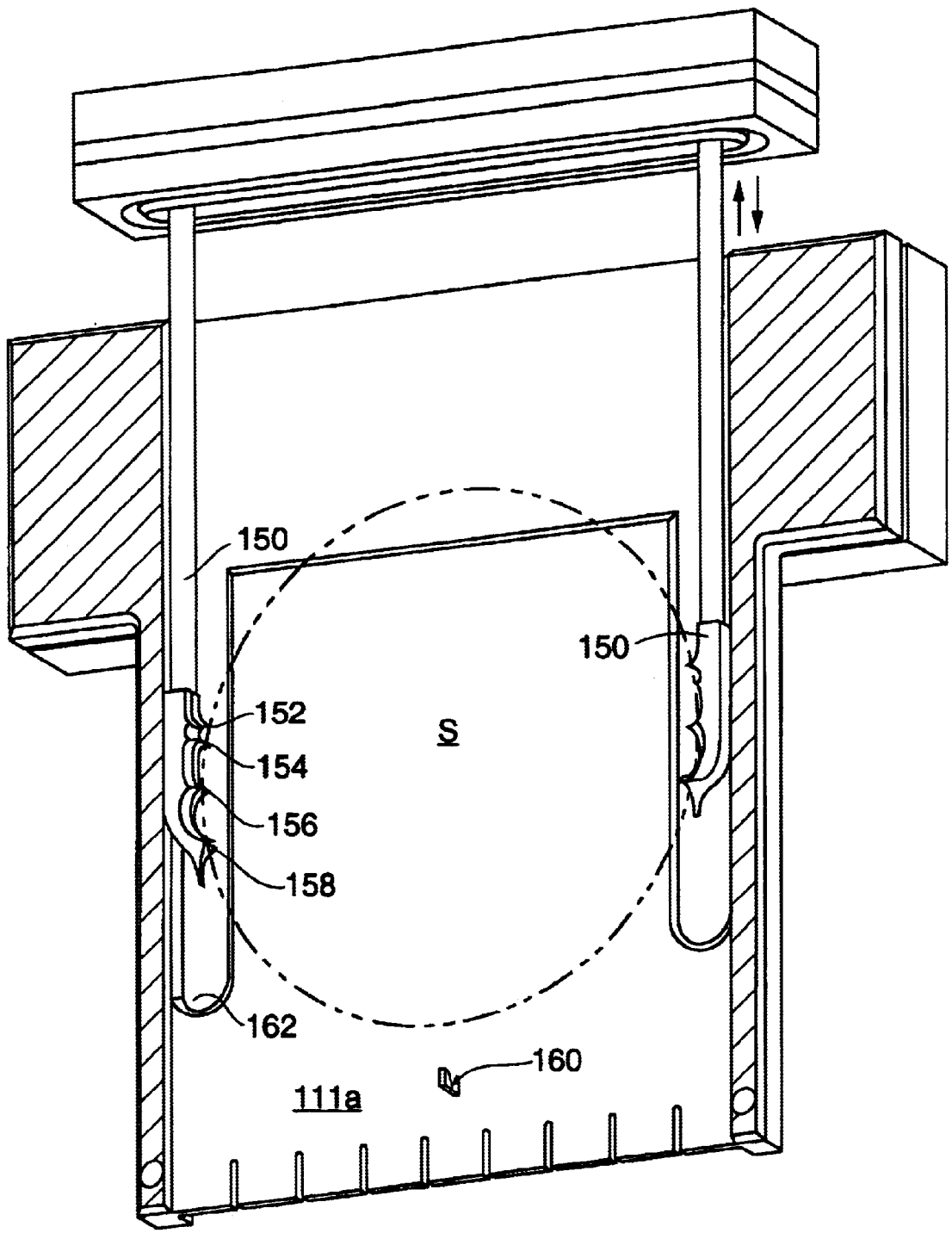
FIG. 7B is a perspective view showing the end effector of FIG. 7A during transport of a substrate into or out of the chamber.
Figure 7C:
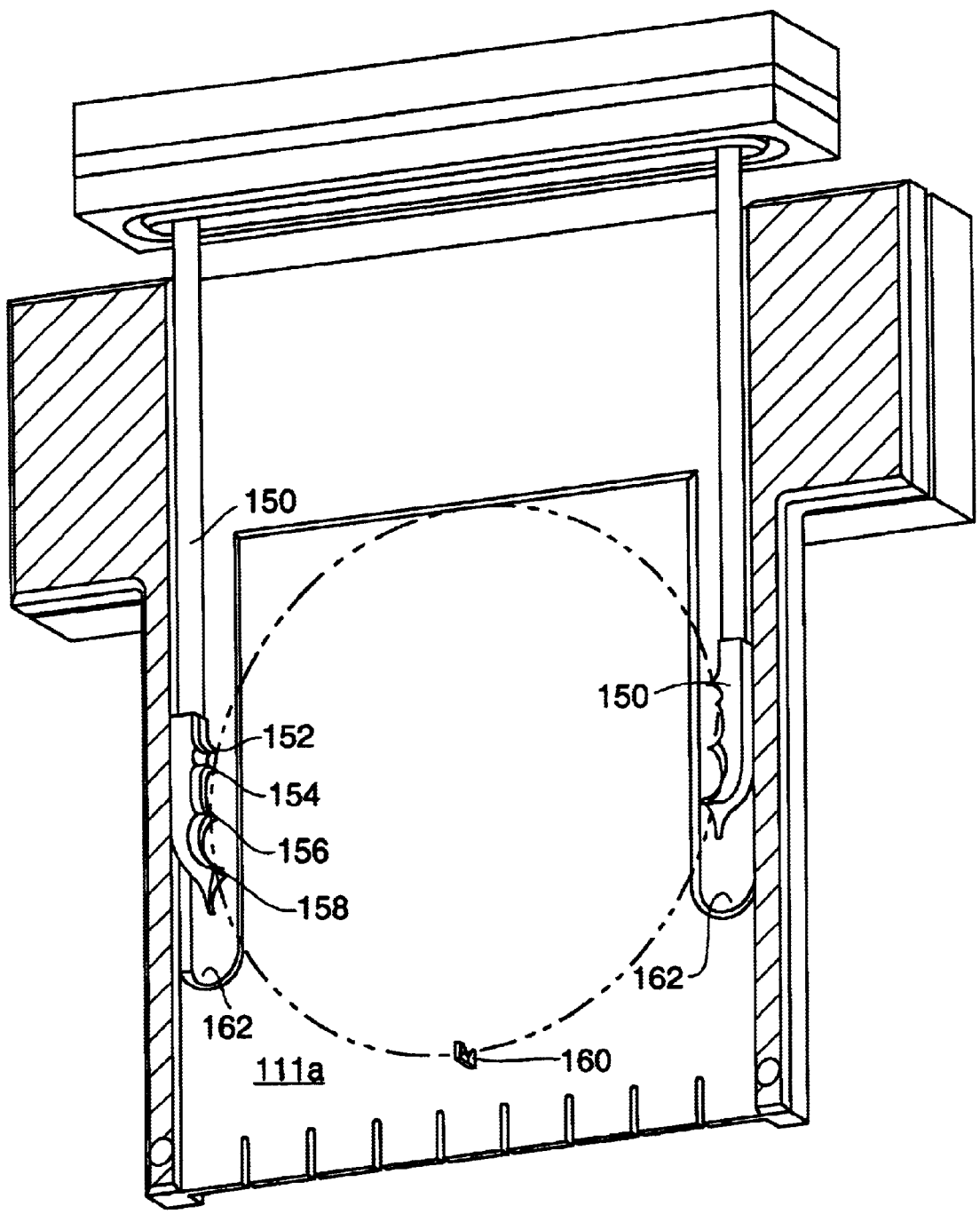
FIG. 7C is a perspective view showing the end effector, substrate and chamber during transport of the substrate into or out of the chamber, with the substrate beginning to make contact with the bottom notch of the chamber.
Figure 7D:
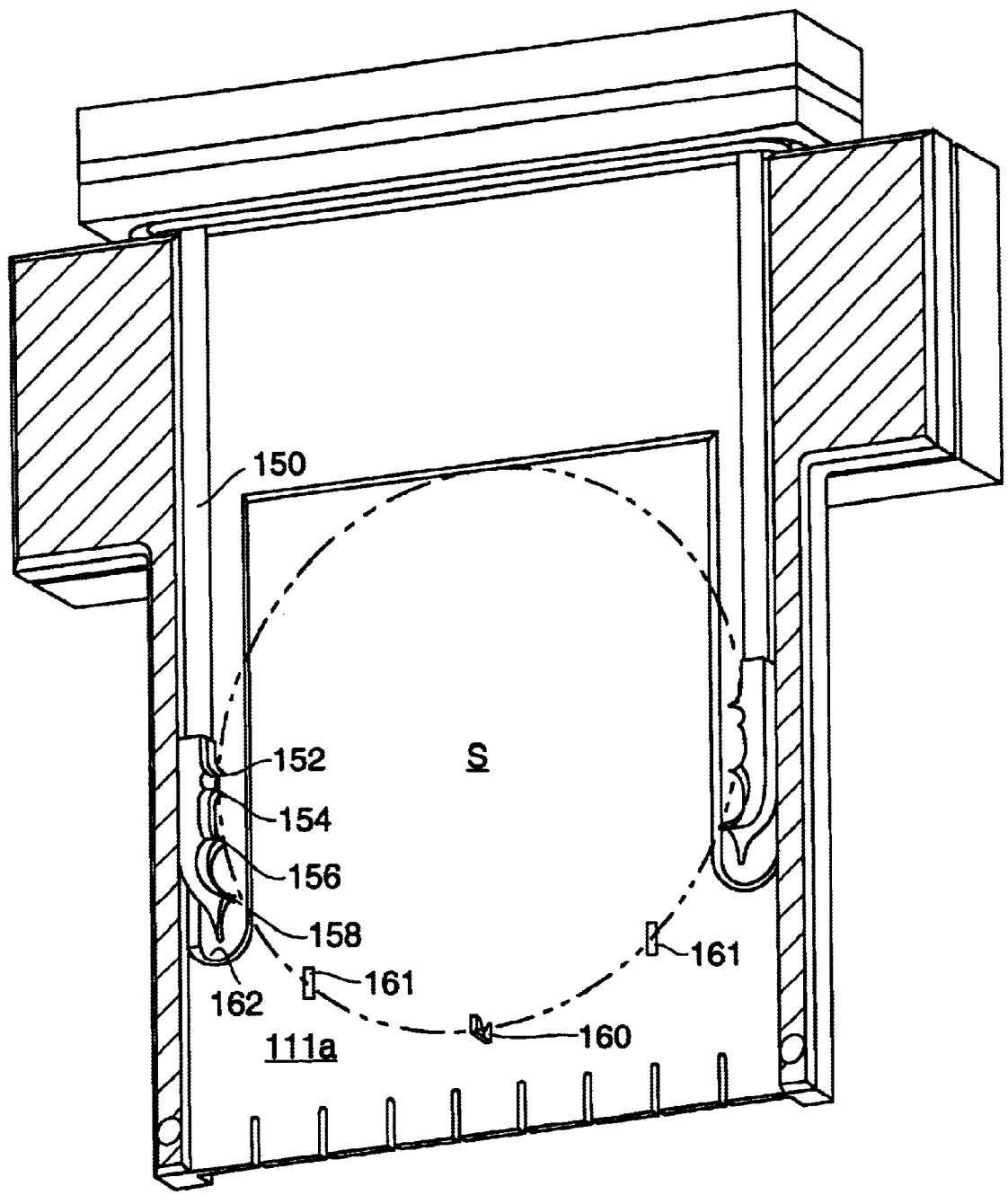
FIG. 7D is a perspective view showing the end effector, substrate and chamber during processing of the substrate within the chamber.
Figure 7E:
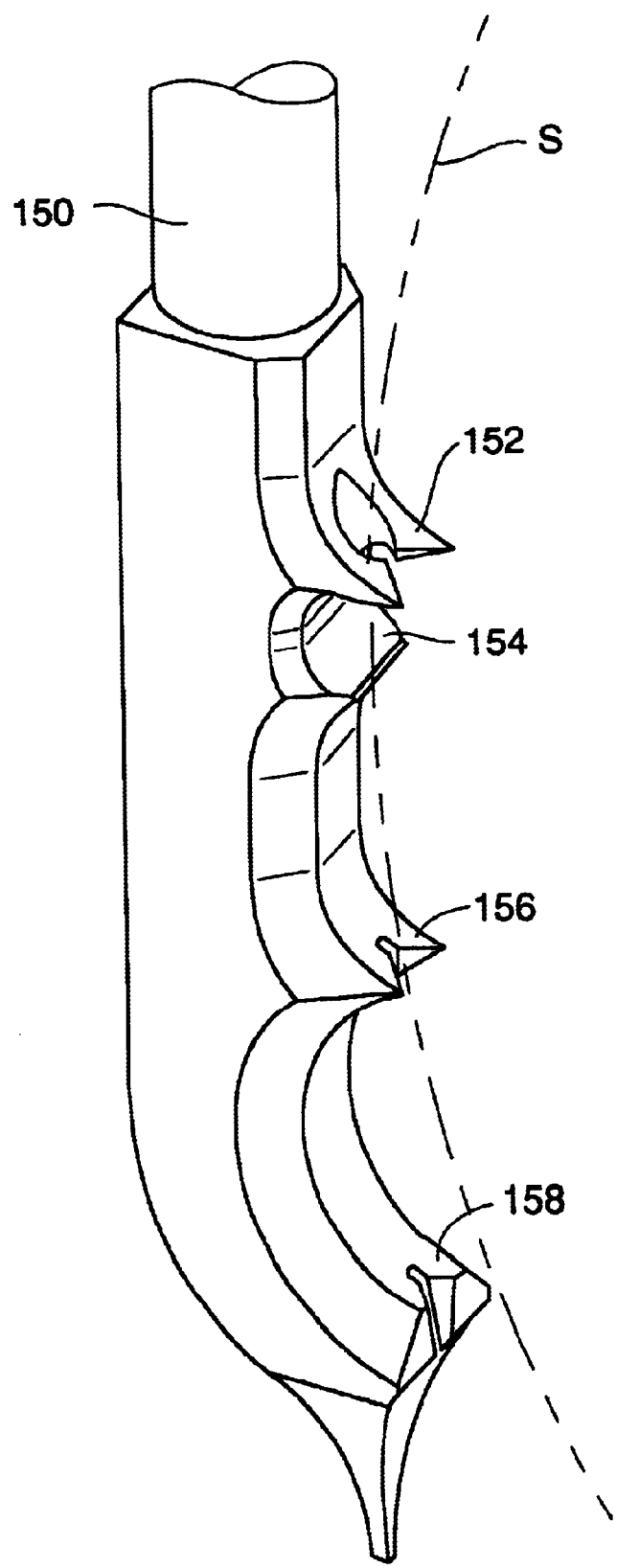
FIG. 7E is a perspective view similar to the view of FIG. 7A showing one prong of the end effector during processing of the substrate within the chamber.

As illustrated in FIGS. 7B–7D, a bottom notch 160 is mounted within the chamber 102a (for example, to a chamber wall 111a as shown). As the substrate is lowered into the process position in the chamber, the bottom edge of the substrate contacts bottom notch 160. Continued downward movement of the end effector 106 causes the substrate to edge to slip out of the upper and lower transport slots 156, 158. Once the substrate has been fully lowered into the process position within the chamber (FIG. 7D), its weight is supported by the bottom notch 160 and support members 152,154 function to stabilize the substrate in this process position. Specifically, as illustrated in FIG. 7E, the substrate edge is disposed between a slot in support member 152, which restricts forward/backward movement of the substrate but preferably does not grip the substrate—thereby keeping the substrate stable while allowing process fluid to flow through the slot. Support member 154 (which preferably does not include a slot) extends towards the substrate edge and restricts lateral movement of the substrate.

Because the chamber walls 111a are closely spaced, the chamber walls preferably include recessed sections 162 (FIGS. 7B–7D) which provide additional space for receiving end effector members 150.

Second Embodiment—Operation

As with the first embodiment, the second embodiment may be used for a variety of steps, including but not limited to wet etch, clean, rinse and drying operations either alone or in combination with one another or with other process steps. Operation of the second embodiment will be described in the context of an etch, clean and drying process, with rinses being performed following etching and cleaning. However it should be understood that various other combinations of processes might be performed without departing from the scope of the present invention. It should also be understood that various steps described in connection with the first embodiment may be practiced using the second embodiment, including the described methods for boundary layer thinning, megasonic-assisted quenching, cleaning, rinsing and/or drying, ozone passivation, chemical injection and exhaustion. Moreover, the rates and other values given as examples in connection with the first embodiment may also be applied to use of the second and third embodiments.

Operation of the second embodiment begins with fluid manifold 130 in the closed position as shown in FIG. 5. DI water is directed into fluid ports 133, through manifold conduit 132 and into the chamber 102 through openings 134. The DI water passes through the lower interior region 113a and cascades over wall 115 into weir 114 and out drain ports 128. At the same time, nitrogen gas flows slowly into the uppermost of the fill ports 122a,b in the vapor/gas manifold, causing the nitrogen gas to flow through the associated conduits 124a, 124b and into the upper region 113b of the chamber 102 via orifices 126a, 126b. This low flow maintains a slight positive pressure within the chamber 102. Preferably, this nitrogen flow continues throughout etching, cleaning, rinsing and drying.

Substrate W is engaged by end effector 106 and moved into the cascading DI water by the automation system. Substrate S is positioned in the lower interior 113a of the chamber. Process fluids necessary for the etching procedure (e.g. HF) are injected into the DI water being delivered to fluid ports 133 into manifold, and are thus passed into the chamber 102 via fluid manifold 130. At the end of the etch procedure, delivery of etch solution into the chamber 102 is terminated. The etch solution may be exhausted from the chamber and rinsing may be carried out preferably using one of the rinse procedures described above. For example, pure DI water may continue to flow into the chamber 102 to flush the etch solution from the chamber and to rinse the substrate, manifold, and chamber.

In an alternative etch procedure, the lower interior 113a may be filled with etch solution, and then the substrate lowered into the static volume of etch solution. After the required dwell time, a cascading rinse or other type of rinse is preferably carried out as described above.

Once the substrate is thoroughly rinsed, a cleaning solution (for example, a solution of water, $NH_2OH$ and $H_2O_2$ that is known in the industry as "SC1") is introduced into the chamber 102 via manifold 130 and caused to cascade over wall 115 into weir 114. After the substrate has been exposed to the cleaning solution for the desired period of time, injection of the cleaning solution into the DI stream is terminated, and pure DI water flows into the chamber 102 to rinse the substrate.

After the final treatment and rinse steps are carried out, the substrate is dried within the chamber 102. Drying may be performed in a number of ways—each of which preferably utilizes IPA vapor generated in a manner similar to that described above.

In one example of a drying process, the bulk water used for the final rinse may be rapidly discharged from the chamber 102 by moving fluid manifold 130 to the opened position (FIG. 3B). A vapor of isopropyl alcohol is then introduced into the upper portion 113b of the chamber by passing the IPA vapor through the vapor/gas inlet port 122a,b, into the corresponding conduit 124a,b and thus into the chamber via openings 126a,b. The IPA vapor flows into lower portion 113a of the chamber, where it condenses on the surface of the substrate where it reduces the surface tension of the water attached to the substrate, and thus causes the water to sheet off of the substrate surfaces. Any remaining liquid droplets may be evaporated from the substrate surface using a gas (e.g. heated nitrogen gas) introduced through the vapor/gas inlet ports 126a, b.

Alternatively, an atmosphere of IPA vapor may be formed in the upper interior region 113b by introducing the vapor via gas/vapor openings 126a,b. According to this embodiment, the end effector 106 lifts the substrate from the lower interior region 113a into the IPA atmosphere in the upper interior region 113b. Withdrawal of the substrate into the IPA atmosphere may occur quickly, i.e. approximately 8 to 30 mm/sec. The IPA vapor condenses on the surface of the substrate, causing the surface tension of the water attached to the substrate to be reduced, and thus causing the water to sheet from the substrate surface. A third opening similar to openings 126a,b may be provided just above overflow weir 114 to allow a vacuum to be applied so as to accelerate evaporation of the IPA or IPA/water mixture. Again, gas such as heated nitrogen may be introduced to dry remaining IPA and/or droplets/film from the substrate.

As another alternative, the substrate may be slowly drawn from the bulk DI water into the IPA vapor. Using this embodiment, the IPA condenses on the liquid meniscus extending between the substrate and the bulk liquid. This results in a concentration gradient of IPA in the meniscus, and results in so-called Marangoni flow of liquid from the substrate surface. Gas (e.g. heated nitrogen gas) may be used following the Marangoni process to remove any residual water droplets.

Third Embodiment—Structure

Figure 8:
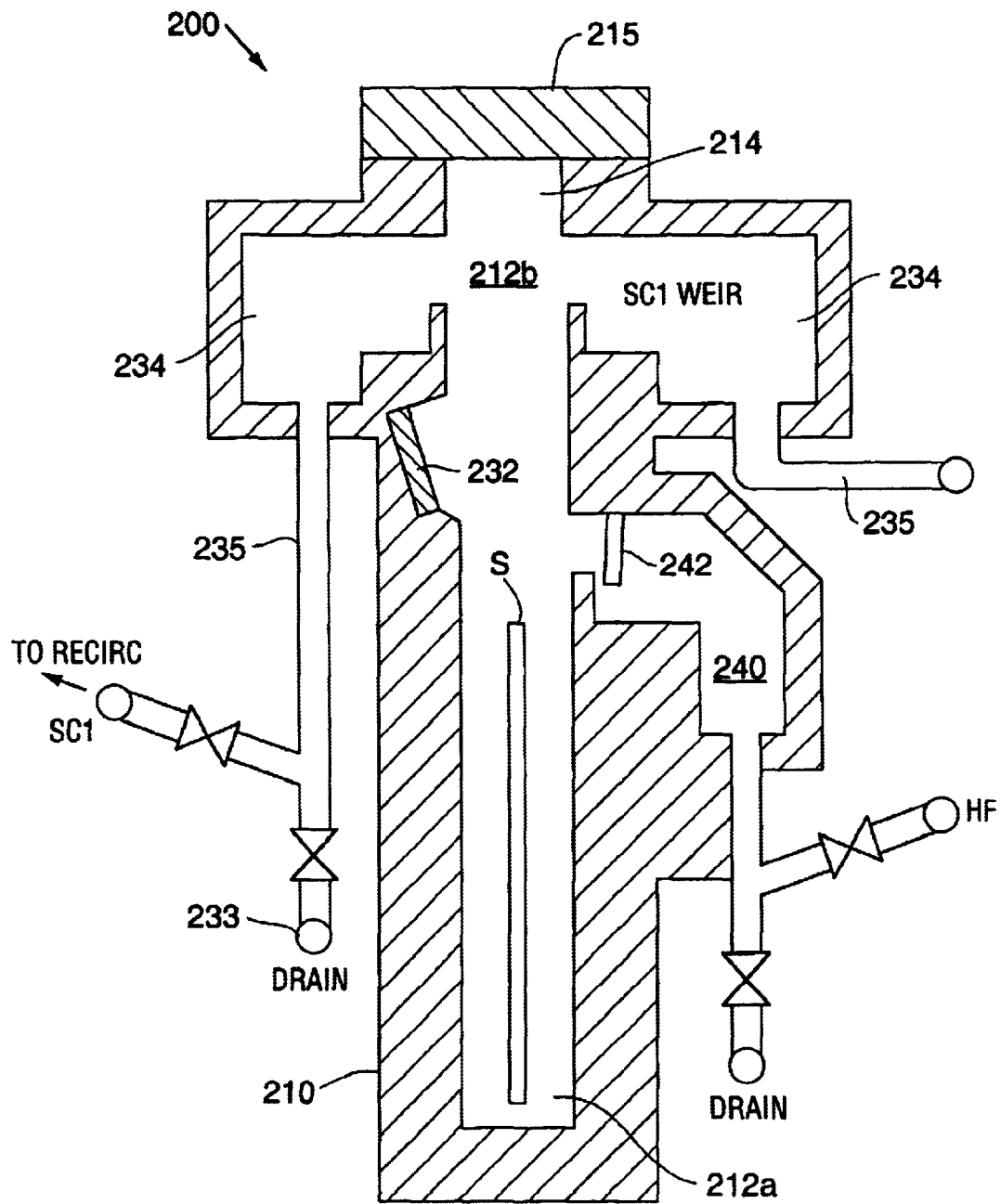
FIG. 8 is a cross-section view of a chamber according to a third embodiment.

Referring to FIG. 8, a third embodiment 200 of a single substrate processing chamber includes a chamber 210 having a lower interior region 212a proportioned to receive a substrate S for processing, an upper interior region 212b, and an opening 214 in the upper interior region 212a.

A substrate transport device (not shown) is provided and includes an end effector configured to engage a substrate S, preferably in the manner shown in FIG. 6. The transport device is driven by conventional automation (not shown) to move the substrate S through opening 214 into, out of, and within the chamber 210 in an edgewise direction.

A lid 215 is provided for sealing opening 214. The lid 215 may be operable with the automation that also drives the end effector, or with separate automation.

A fluid handling system (not shown) is configured to carry various process fluids (e.g. etch fluids, cleaning fluids, rinse water etc.) into the lower interior region 212a of the chamber 210. The fluid handling system may take a variety of forms, including those described with respect to FIGS. 1A–1D, and 5.

One or more megasonic transducers (not shown) are provided in the lower region 212a of the chamber 210. The lower transducer may be mounted to the walls of the chamber 210 in a manner known in the art, or it may comprise a portion of a manifold assembly as described above. When the lower megasonic transducer directs megasonic energy into fluid in the chamber, it induces acoustic streaming within the fluid—i.e. streams of microbubbles that aid in removal of contaminants from the substrate by keeping particles in motion within the process fluid so as to avoid their reattachment to the substrate.

Vapor inlet ports, fluid applicators, and gas manifolds extend into the upper interior region 212b of the chamber 210. Each is fluidly coupled to a system of conduits that deliver the appropriate fluids, vapors and gases to the ports as needed during processing.

An upper overflow weir 234 is positioned below the opening 214. Process fluid flowing through the chamber and past substrate S cascades into the weir 234 and into overflow conduits 235 for recirculation back into the fluid handling system and re-introduction into the chamber, or into drain 233. One more megasonic transducers 232 (one shown in FIG. 8), which may include a single transducer or an array of multiple transducers, is positioned at an elevation below that of the weir 234, and is oriented to direct megasonic energy into an upper portion of the chamber 210.

The energy interacts with the substrate as the substrate is moved upwardly and downwardly though the chamber 210 by the end effector. It is desirable to orient the transducer such that its energy beam interacts with the substrate surface at or near the surface of the process fluid, e.g. at a level within the top 0–20% of the chamber region lying below the elevation of upper weir 234. The transducers may be configured to direct megasonic energy in a direction normal to the substrate surface or at an angle from normal. Preferably, energy is directed at an angle of approximately 0–30 degrees from normal, and most preferably approximately 5–30 degrees from normal. The power and orientation of the transducer(s) may be adjustable in the manner described in connection with the first embodiment.

When energized, the transducer 232 creates a zone Z of optimal performance within the process fluid in the chamber. As will be discussed in greater detail below, energization of the zone enhances post-etch quenching, cleaning, rinsing and drying processes through regional boundary layer thinning and microcavitation.

A lower weir 240 is positioned beneath the elevation of the transducer 232. Lower weir 240 optionally includes a door 242 having a closed position, which prevents flow of fluid into the weir. When weir 240 is in the closed position, fluid flowing into the chamber flows past transducer 232 and cascades over upper weir 234. When lower weir 240 is in the opened position, fluid flowing into the chamber cascades through weir 234 and does not flow into contact with transducer 232. The lower weir 240 is used to shunt away harsh chemicals (such as an etch solution utilizing hydrofluoric acid) that can damage the megasonic transducer. Although some transducer materials such as sapphire or Teflon can resist the harsh effects of such chemicals, those materials are very expensive and will increase the overall cost of the chamber. Moreover, providing a separate weir for harsh chemicals also helps to keep those chemicals out of conduits used to carry other solutions, such as the conduits 235 that re-circulate cleaning and rinsing solutions, and thus minimizes cross-contamination of fluids.

Third Embodiment—Operation

Use of the chamber 200 will be described in the context of an etch, clean and drying process, in which rinses are performed following etching and cleaning. Naturally, various other combinations of these or other process steps may be performed without departing from the scope of the present invention.

Etching

An etch operation preferably begins with the lower portion 212a of the chamber 210 filled with process fluids necessary for the etching procedure (for example hydrofluoric acid (HF), ammonium fluoride and HF, or buffered oxide). These fluids are introduced via the fluid handling system that directs process fluids into the lower end of the chamber.

A substrate S is engaged by the end effector (such as end effector 30 of FIG. 6) and is moved into the etch solution. Substrate S is positioned in the lower portion 212a of the chamber such that its upper edge is below the elevation of lower weir 240. If provided, the door 242 of lower weir 240 is moved to the opened position. Etch solution continues flowing into the chamber 210, and cascades into weir 240.

The etch preferably includes boundary layer thinning to assist the etch solution in reaching and thus reacting with the substances that are to be removed from the substrate surface. Boundary layer thinning may be accomplished by inducing turbulence in the flowing etch fluid using disturbances formed into the sidewalls of the chamber. The induced turbulence may be enhanced using relatively high fluid flow rates and temperatures for the etch solution. Other mechanisms for inducing turbulence in the etch solution, including those described in connection with the first and second embodiments, may also be utilized.

Post-Etch Quench and Rinse

At the end of the etch procedure, flow of etch solution is terminated and a post-etch rinsing step may be carried out to remove etch solution from the substrate and chamber.

The post-etch rinse process preferably includes a quenching process, which accelerates diffusion of the etch chemistry from the surface of the substrate out of the boundary layer of fluid attached to the substrate and into the surrounding bulk fluid. Quenching is preferably initiated using a rapid removal (e.g. in preferably, but not limited to, less than approximately 1.0 second), of etch solution from the lower end chamber 210, such as using sealed pressure chambers such as the chambers 31a described in connection with FIG. 1C. Quickly removing the bulk etch solution from the chamber minimizes etch variations across the substrate surface by more sharply ending the exposure of the substrate to the bulk etch fluid. This process is preferably enhanced by simultaneously withdrawing the substrate from the chamber lower portion 212a into the upper portion 212b using the substrate transport.

Next, the lower weir 240 is moved the closed position and the chamber 210 is rapidly filled with a quenchant such as DI water. Since at this time the substrate is in the upper portion 212b of the chamber, rapid filling can be performed without concern that the substrate will be splashed—an occurrence which could lead to lack of uniformity across the substrate's surface. As the chamber 210 begins to fill, the megasonic transducer in the chamber bottom is operated at low power. Once the lower portion 212a of the chamber has been partially filled, the substrate is lowered into the quenchant. The turbulence created by the megasonic energy facilitates boundary layer thinning that thus facilitates diffusion of etch chemistry from the boundary layer into the bulk rinse water.

The megasonic power is increased as the volume of quenchant in the chamber increases. Beginning at a lower power and increasing the power as the chamber fills minimizes the chance of high power megasonic energy causing splashing of quenchant onto the substrate, and also minimizes the likelihood that residual etch solution on the substrate and in the tank would aggressively etch the bottom portion of the substrate immersed in the water.

Figure 2A:
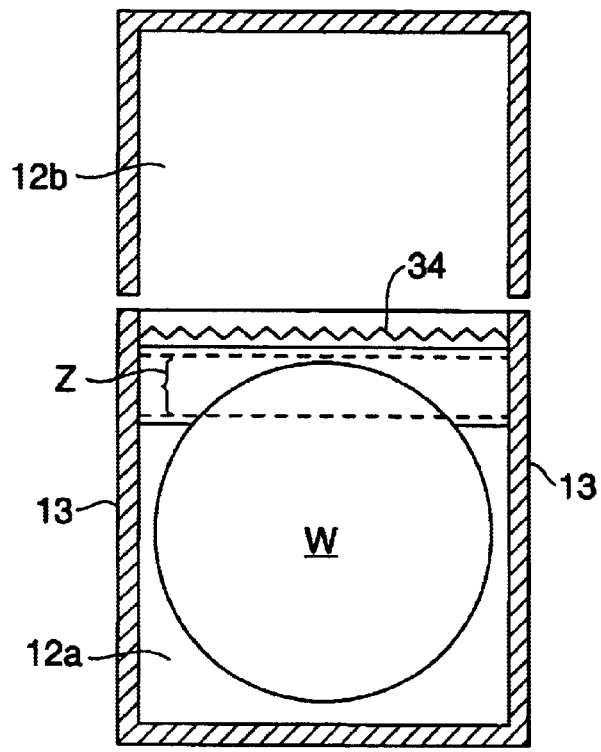
FIGS. 2A–2C are a sequence of cross-section views of the chamber interior, illustrating movement of the substrate between the upper interior region and the lower interior region.
Figure 2B:
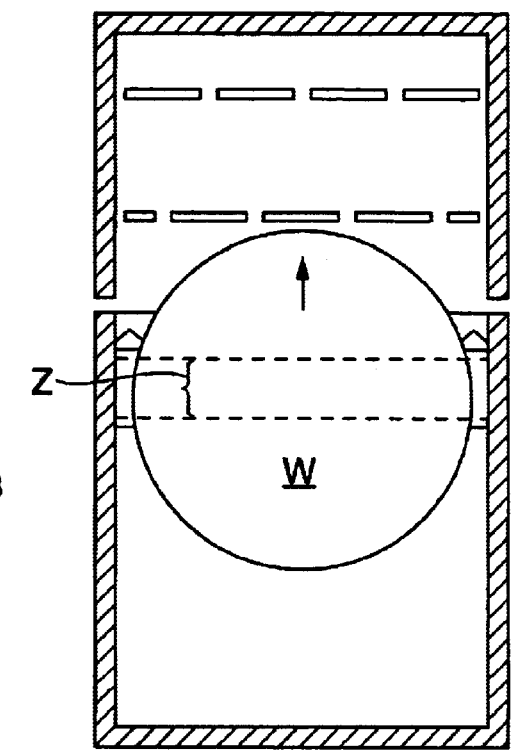
Figure 2C:
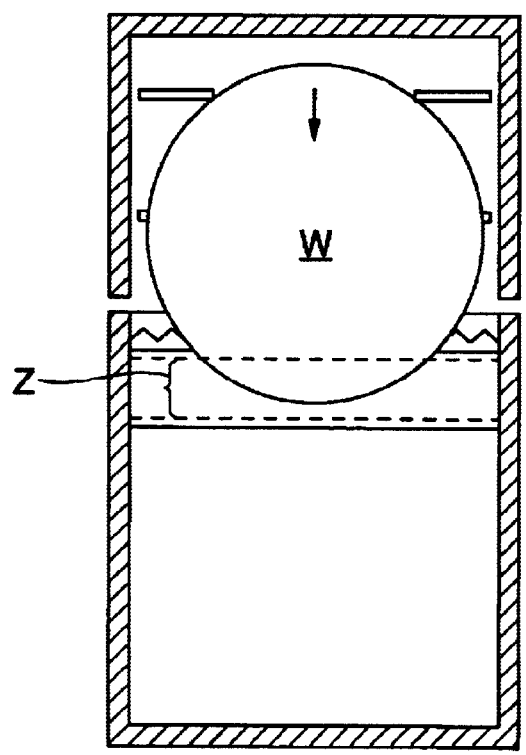

The flow of DI water or other quenchant into the chamber preferably continues even after the substrate is fully immersed. Because lower weir 240 is closed, the fluid level rises above megasonic transducer 232 and cascades into upper weir 234. The upper megasonic transducer 232 is energized and imparts megasonic energy into an adjacent region of the DI water in zone Z (FIGS. 2A through 2C). In zone Z, the turbulence created by the megasonic energy causes boundary layer thinning and thus facilitates gettering of the etch material away from the substrate and into the fresh quenchant. The substrate is pulled through zone Z and is raised and lowered through zone Z one or more times as needed for a thorough quench. As with prior embodiments, the area of the band is preferably selected such that when the substrate passes through the zone, up to 30% of the surface area of a face of the substrate is positioned within the band. Most preferably, as the center of the substrate passes through the zone preferably approximately 3–30% of the surface area of one face of the substrate is positioned within the band.

As the substrate is lowed from the upper region 212b into the bulk rinse fluid, particles entrained at the substrate surface are released at the air/liquid interface and are flushed over the weir and out of the chamber 210.

The quenching process may be enhanced by a stream of DI water preferably directed into upper region 212b through fluid applicators (such as applicators 37 described in connection with the first embodiment) located in the upper region. As the substrate transport pulls the substrate through the chamber, the substrate passes through zone Z and through the stream of fresh water. During movement of the substrate upwardly past the fluid stream, the fluid stream applies a thin layer of fresh rinse fluid to the portion of the substrate at which the boundary layer was just thinned by zone Z. The substrate may be moved upwardly and downwardly through the zone Z and the fluid stream one or more times as needed for a thorough quench.

As previously discussed, the timing of energization of the transducers 232 may depend on the goals of the process or the nature of the substrate surface (e.g. whether it is hydrophobic or hydrophilic). In some instances it may be desirable to energize the transducers 232 only during extraction of the substrate from lower region 212a into upper region 212b, or only during insertion of the substrate into lower region 212a, or during both extraction and insertion.

After quenching, DI water may continue to circulate through the chamber until such time as the chamber, end effectors and substrate have been thoroughly rinsed.

Cleaning

Prior to cleaning, the chamber is drained in using one of a variety of methods, including one of the methods described above. During the cleaning process, a cleaning solution (e.g. an "SC1" solution or a back-end cleaning solution) is introduced into the chamber 210 using the fluid handling system. Lower weir 240 remains in closed position and thus allows the cleaning fluid to rise above transducer 232 and to cascade over upper weir 234.

Megasonic transducer 232 is energized during cleaning so as to impart megasonic energy into zone Z. The substrate transport moves the substrate upwardly and downwardly one or more times in an edgewise direction to move the entire substrate through the zone Z. As with the quenching process, the timing of energization of the transducers 232 may be selected depending on the goals of the process.

The zone Z optimizes cleaning for a number of reasons. First, cleaning efficiency is enhanced by creating regional turbulence that thins the boundary layer and thus allows the cleaning solution to effectively contact the substrate surface. The megasonic energy further causes microcavitation within the fluid, i.e. formation of microbubbles that subsequently implode, releasing energy that dislodges particles from the substrate. Microcavitation may be enhanced by introducing a gas such as nitrogen, oxygen, helium or argon into upper interior region 212b via a gas inlet port, such that the gas diffuses into the volume of cleaning solution that is near the surface of the cleaning solution.

Second, the megasonic turbulence also keeps particles in the fluid suspended in the bulk and less likely to be drawn into contact with the substrate. Finally, high velocity fluid flow through the chamber and over the weir moves particles away from the zone and thus minimizes re-attachment.

A megasonic transducer in the lower region 212b may be activated during the cleaning process, so as to create an acoustic streaming effect within the chamber, keeping liberated particles suspended in the bulk fluid until they are flushed over the weir 234. This minimizes the chance of particle reattachment. To further minimize the chance of particle reattachment, a particle gettering surface (not shown) may be positioned in the chamber near zone Z. During cleaning, a charge is induced on the gettering surface such that particles liberated from the substrate surface are drawn to the gettering surface and thus away from the substrate. After the substrate has passed out of zone Z, the polarity of the gettering surface is reversed, causing release of particles from the gettering surface. These released particles are flushed out of the chamber 10 and into the weir by the flowing cleaning fluid.

The cleaning process will result in release of gases from the cleaning solution into the upper interior region 212b, some of which may contact exposed regions of the substrate and cause pitting at the substrate surface. To avoid such exposure, select vapors are introduced into the upper region 212b via a vapor inlet port so as to form a protective film on the substrate. If reactive gases released from the cleaning solution condense on the substrate, they will react with the protective film rather than reacting with the silicon surface of the substrate. For example, an SC1 cleaning solution will cause off-gassing of ammonia into the chamber. In this example, hydrogen peroxide vapor would be introduced into the upper region 212b to form a protective film on the substrate. Ammonia released by the cleaning solution will react with the protective film rather than pitting the substrate surface.

After the substrate has been exposed to cleaning solution for the required process time, the substrate is rinsed using a rinse solution. The rinse solution naturally will be dependent on the cleaning process being carried out. Rinsing may be accomplished in various ways. In one example, the substrate is elevated above the cleaning solution in the chamber and the cleaning solution is withdrawn from the chamber using a low pressure container such as container 31b described above. Rinse fluid is introduced into the chamber 210 and cascades over the upper weir 234.

The substrate is lowered into the rinse fluid and the fluid rinses the cleaning solution from the chamber 210 and from the surface of the substrate. Megasonic energy from the side transducers 232 and/or a lower transducer is optionally directed into the chamber so as to enhance the rinse process. The substrate may be passed through zone Z multiple times as needed for thorough rinsing. A gas such as nitrogen, oxygen, helium or argon may be introduced into upper interior region 212b. The gas diffuses into the volume of rinse fluid that is near the gas/liquid interface (i.e. the interface between the upper surface of the rinse fluid and that gas above it) and increases the microcavitation effect of the megasonic transducers in zone Z.

The power state of the transducers is selected as appropriate for the stage of the rinsing process and the surface state of the substrate. Preferably, the side transducer 232 and the lower transducer are powered "on" during insertion of the substrate into the rinse fluid. Depending upon the surface state of the substrate (e.g. whether it is hydrophilic or hydrophobic), the side transducer 232 may be on or off during extraction of the substrate into the upper region 12b.

Drying

The final rinse may be followed by any of a variety of drying processes, including (but not limited to) those described in connection with the first and second embodiments.

Three embodiments utilizing principles of the present invention have been described. These embodiments are given only by way of example and are not intended to limit the scope of the claims—as the apparatus and method of the present invention may be configured and performed in many ways besides those specifically described herein. Moreover, numerous features have been described in connection with each of the described embodiments. It should be appreciated that the described features may be combined in various ways, and that features described with respect to one of the disclosed embodiments may likewise be included with the other embodiments without departing from the present invention.

We claim:

1. A method of individually treating substrates, comprising the steps of:
   (a) enclosing only one substrate within a process chamber, the process chamber proportioned to process only one substrate at a time;
   (b) exposing the substrate to a chemical treatment fluid within the process chamber;
   (c) after step (b), exposing the substrate to a rinse fluid within the process chamber; and
   (d) after step (c), exposing the substrate to a drying vapor within the process chamber.

2. The method of claim 1, wherein step (b) includes the step of thinning a boundary layer of fluid at the substrate surface.

3. The method of claim 2 wherein the chemical treatment fluid is an etching fluid.

4. The method of claim 3 wherein the step of thinning the boundary layer includes the step of creating turbulence within the etching fluid in the chamber.

5. The method of claim 4 wherein the chamber includes a wall having varying topography, and wherein the step of creating turbulence includes flowing etching fluid past the wall and the substrate.

6. The method of claim 4 wherein the step of creating turbulence includes directing megasonic energy into the etching fluid in the chamber.

7. The method of claim 4 wherein the step of creating turbulence includes directing etching fluid into the chamber in a direction transverse to the orientation of the substrate.

8. The method of claim 3 wherein the etching fluid includes at least one of the group of etching fluids consisting of hydrofluoric acid, ammonium fluoride, and buffered oxide.

9. The method of claim 3 further including the step of removing the bulk etching fluid from the chamber.

10. The method of claim 9 wherein the chamber includes a container fluidly coupled to the chamber, and wherein the removing step includes suctioning the etching fluid into the container.

11. The method of claim 10 wherein prior to the suctioning step the container is sealed and maintained at a negative pressure, and wherein the removing step includes opening a valve between the chamber and the container, causing the etching fluid to be drawn into the container.

12. The method of claim 9 wherein the removing step includes cascading rinse water through the chamber to flush out the etching fluid.

13. The method of claim 1 including the step of directing megasonic energy into rinse fluid in the chamber during the rinsing step.

14. The method of claim 13 wherein the directing step includes forming a band of megasonic energy propagating towards a surface of the substrate, and wherein the method further includes moving the substrate through the band in an edgewise direction to cause substantially the entire surface of the substrate to pass through the band.

15. The method of claim 14 wherein the megasonic energy induces thinning of a boundary layer on the portion of the substrate passing through the band.

16. The method of claim 14 wherein during step (c) a lower region of the chamber contains rinse fluid and an upper region of the chamber contains gas, wherein the band is adjacent to a gas-liquid interface between the rinse fluid and gas.

17. The method of claim 14 wherein the substrate includes a face having a surface area, and wherein approximately 30% or less of the surface area of the face is positioned within the band during the moving step.

18. The method of claim 14, wherein the moving step includes passing the substrate through the band a plurality of times.

19. The method of claim 16 wherein the moving step includes passing the substrate through the gas-liquid interface into the upper region of the chamber.

20. The method of claim 19, including passing the substrate through the gas-liquid interface a plurality of times.

21. The method of claim 19 further including the step of directing rinse water onto a portion of the substrate within the upper region of the chamber.

22. The method of claim 14 wherein the megasonic energy is propagated in a direction normal to the substrate surface.

23. The method of claim 14 wherein the megasonic energy is propagated at an angle that is less than normal to the substrate surface.

24. The method of claim 1 wherein step (b) includes exposing the substrate to a cleaning fluid in the chamber.

25. The method of claim 24, further including directing megasonic energy into the cleaning fluid, forming a band of megasonic energy propagating towards a surface of the substrate, and wherein the method further includes moving the substrate through the band in an edgewise direction to cause substantially the entire surface of the substrate to pass through the band.

26. The method of claim 25, wherein the moving step includes passing the substrate through the band a plurality of times.

27. The method of claim 25 wherein the megasonic energy induces thinning of a boundary layer on the portion of the substrate passing through the band.

28. The method of claim 25 wherein during step (c) a lower region of the chamber contains cleaning fluid and an upper region of the chamber contains gas, wherein the band is adjacent to a gas-liquid interface between the cleaning fluid and gas.

29. The method of claim 25 wherein the substrate includes a face having a surface area, and wherein approximately 30% or less of the surface area of the face is positioned within the band during the moving step.

30. The method of claim 28 wherein the moving step includes passing the substrate through the gas-liquid interface into the upper region of the chamber.

31. The method of claim 30, including passing the substrate through the gas-liquid interface a plurality of times.

32. The method of claim 25 wherein the megasonic energy is propagated in a direction normal to the substrate surface.

33. The method of claim 25 wherein the megasonic energy is propagated at an angle that is less than normal to the substrate surface.

34. The method of claim 25, further including the step of causing cleaning fluid to flow through the chamber.

35. The method of claim 34, wherein the cleaning fluid flows from a bottom portion of the chamber to an upper portion of the chamber.

36. The method of claim 28, wherein the megasonic energy induces microcavitation in the band, and wherein the method further includes diffusing a gas into the cleaning fluid at the gas-liquid interface to increase the rate of microcavitation in the band.

37. The method of claim 25, further including inducing acoustic streaming within the cleaning fluid by imparting megasonic energy into the cleaning fluid in a region beneath the band.

38. The method of claim 24 wherein the method further includes exposing the substrate to an etching fluid in the chamber.

39. The method of claim 1 wherein the drying step includes removing bulk fluid from the chamber, and introducing a drying vapor into the chamber.

40. The method of claim 1 wherein, during the drying step a lower region of the chamber contains rinse fluid, and wherein the drying step includes forming an atmosphere of drying vapor in an upper region in the chamber, and withdrawing the substrate from bulk fluid in a lower region of the chamber into the upper region of the chamber.

41. The method of claim 40 further including directing megasonic energy into the rinse fluid, forming a band of megasonic energy propagating towards a surface of the substrate, wherein the withdrawing step causes the substrate to pass through the band, and wherein the megasonic energy induces thinning of a boundary layer on the portion of the substrate passing through the band.

42. The method of claim 41 wherein the withdrawing step is performed at a rate of approximately 8–30 mm/sec.

43. The method of claim 41 wherein the megasonic energy is propagated in a direction normal to the substrate surface.

44. The method of claim 41 wherein the megasonic energy is propagated at an angle that is less than normal to the substrate surface.

45. The method of claim 40 wherein the withdrawing step is performed slowly, causing removal of fluid from the substrate surface using a surface tension gradient.

46. The method of claim 45 wherein the withdrawing step is performed at a rate of approximately 0.25–5 mm/sec.

47. The method of claim 1 wherein the drying step includes the steps of exposing the substrate to a process fluid in the chamber, performing a quick dump to discharge the process fluid from the chamber, leaving residual process fluid on the surface of the substrate, and introducing a drying vapor into the system, the drying vapor condensing on the surface of the substrate and reducing the surface tension of the residual process fluid, causing the residual process fluid to flow off of the surface.

48. The method of claim 47 wherein the quick dump discharges the process fluid in less than approximately 5 seconds.

49. The method of claim 47 wherein the drying vapor includes isopropyl alcohol vapor.

50. The method of claim 47 further including the step of introducing a heated gas into the chamber to volatilize condensed drying vapor from the surface of the substrate.

51. The method of claim 1 wherein step (b) includes exposing the substrate to an etching fluid, and wherein the method further includes the step of exposing the substrate to a cleaning fluid.

52. The method of claim 50 wherein the step of exposing the substrate to a cleaning fluid is performed after step (c) and before step (d).

53. The method of claim 52, further including the step of rinsing cleaning fluid from the substrate prior to step (d).

54. A method of treating and drying a substrate, the method comprising the steps of:
  (a) providing a chamber proportioned to process only a single substrate, the chamber including a lower portion and an upper portion;
  (b) exposing a single substrate to a process fluid in the lower portion of the chamber;
  (c) directing megasonic energy into the process fluid,
  (d) forming an atmosphere of drying vapor in an upper region in the chamber;
  (e) during step (c), withdrawing the substrate from the process fluid in a lower region of the chamber into the upper region of the chamber, wherein the megasonic energy induces thinning of a boundary layer on the substrate.

55. The method of claim 54 wherein step (c) forms a band of megasonic energy propagating towards a surface of the substrate, wherein the withdrawing step causes the substrate to pass through the band, and wherein the megasonic energy induces thinning of a boundary layer on the portion of the substrate passing through the band.

56. The method of claim 55 wherein the withdrawing step is performed at a rate of approximately 8–30 mm/sec.

57. The method of claim 56 wherein the megasonic energy is propagated in a direction normal to the substrate surface.

58. The method of claim 56 wherein the megasonic energy is propagated at an angle that is less than normal to the substrate surface.

59. The method of claim 54 further including, after step (e), introducing a heated gas into the chamber to evaporate condensed drying vapor from the surface of the substrate.

60. The method of claim 59 wherein the heated gas is introduced through one or more inlets into the chamber, and wherein the method further includes translating the substrate past the inlets to accelerate evaporation.

61. A method of drying a substrate, the method comprising the steps of:
  (a) providing a chamber proportioned to process only a single substrate;

(b) exposing a single substrate to a process fluid in the chamber;

(c) performing a quick dump to discharge the process fluid from the chamber, leaving residual process fluid on the surface of the substrate; and (d) introducing a drying vapor into the system, the drying vapor condensing on the surface of the substrate and reducing the surface tension of the residual process fluid, causing the residual process fluid to flow off of the surface.

62. The method of claim 61 wherein step (a) provides a system including a chamber, and wherein the method further includes the step of exhausting the drying vapor from the system after step (d).

63. The method of claim 61 wherein the quick dump discharges the process fluid in less than approximately 5 seconds.

64. The method of claim 61 wherein the drying vapor includes isopropyl alcohol vapor.

65. The method of claim 61 further including the step of introducing a heated gas into the chamber to volatilize condensed drying vapor from the surface of the substrate.

66. The method of claim 61 wherein the drying vapor introduced in step (d) condenses on substantially the entire surface of the object.

67. The method of claim 65 wherein the heated gas is introduced through one or more inlets into the chamber, and wherein the method further includes translating the substrate past the inlets to accelerate evaporation.

68. An apparatus for individually treating substrates, comprising:
   a process chamber proportioned to process only one substrate at a time;
   a source of chemical treatment fluid fluidly coupled to the process chamber;
   a source of rinse fluid fluidly coupled to the process chamber; and
   a source of drying vapor fluidly coupled to the process chamber.

69. The apparatus of claim 68, further including means for thinning a boundary layer of fluid at the substrate surface when the substrate is disposed in a fluid within the chamber.

70. The apparatus of claim 69 wherein the means for thinning the boundary layer includes means for creating turbulence within fluid in the chamber.

71. The apparatus of claim 70 wherein the means for creating turbulence includes a chamber and an inlet in the chamber for flowing fluid past the wall and the substrate.

72. The apparatus of claim 70 wherein the means for creating turbulence includes a megasonic transducer positioned to direct megasonic energy into fluid in the chamber.

73. The apparatus of claim 70 wherein the means for creating turbulence includes an inlet in the chamber oriented to direct fluid into the chamber in a direction transverse to the orientation of the substrate.

74. The apparatus of claim 68 further including a sealed negative pressure container coupled to the chamber, and a closed valve between the chamber and the container, the valve moveable to an opened position to cause suction of fluid from the chamber into the container.

75. The apparatus of claim 74 including a second sealed negative pressure container coupled to the chamber, and a second closed valve between the chamber and the container, the second valve moveable to an opened position to cause suction of fluid from the chamber into the second container.

76. The apparatus of claim 68 including at least one megasonic transducer positioned to direct megasonic energy into fluid in the chamber.

77. The apparatus of claim 76 wherein the megasonic transducer is oriented to form a band of megasonic energy propagating towards a surface of a substrate in the chamber, and wherein the apparatus further includes an end effector moveable between upper and lower regions of the chamber for moving the substrate through the band in an edgewise direction to cause substantially the entire surface of the substrate to pass through the band.

78. The apparatus of claim 77 wherein the megasonic energy induces thinning of a boundary layer on the portion of the substrate passing through the band.

79. The apparatus of claim 77 wherein the lower region of the chamber is configured to contain a fluid and the upper region of the chamber is configured to contain gas, and wherein the band is adjacent to a gas-liquid interface between the rinse fluid and gas.

80. The apparatus of claim 77 wherein the substrate includes a face having a surface area, and wherein the band is proportioned such that a maximum of approximately 30% or less of the surface area of the face is positioned within the band when the substrate passes through the band.

81. The apparatus of claim 77, wherein the end effector is configured to move the substrate through the band a plurality of times.

82. The apparatus of claim 79 wherein the end effector is configured to pass the substrate through the gas-liquid interface into the upper region of the chamber.

83. The apparatus of claim 79, wherein the end effector is configured to pass the substrate through the gas-liquid interface a plurality of times.

84. The apparatus of claim 82 wherein the chamber further includes a source of rinse water fluidly coupled to the upper region of the chamber, the source configured to direct rinse water onto a portion of the substrate within the upper region of the chamber.

85. The apparatus of claim 77 wherein the megasonic transducer is oriented to propagate energy in a direction normal to the substrate surface.

86. The apparatus of claim 77 wherein the megasonic energy is oriented to propagate energy at an angle that is less than normal to the substrate surface.

87. The apparatus of claim 68 wherein the chemical treatment solution is a cleaning solution.

88. The apparatus of claim 68 wherein the chemical treatment solution is an etch solution.

89. The apparatus of claim 88 wherein the etch solution includes at least one etching fluid from the group consisting of hydrofluoric acid, ammonium fluoride, and buffered oxide.

90. The apparatus of claim 79, wherein the megasonic transducer is further configured to induce microcavitation in the band, and wherein the apparatus further includes a source of gas fluidly coupled to the chamber and a gas outlet in the chamber, the gas outlet positioned to diffuse gas into the cleaning fluid at the gas-liquid interface to increase the rate of microcavitation in the band.

91. The apparatus of claim 77, further including a second megasonic transducer positioned to direct megasonic energy into fluid in the chamber in a region beneath the band.

92. The apparatus of claim 91 wherein the second megasonic transducer is configured to induce acoustic streaming in the fluid.

93. The apparatus of claim 68 wherein the source of drying vapor directs drying vapor into an upper region of the chamber, and wherein the end effector is configured to withdraw the substrate from fluid in a lower region of the chamber into drying vapor in the upper region of the chamber.

94. The apparatus of claim 93 wherein the end effector is configured to withdraw the substrate at a rate of approximately 8–30 mm/sec.

95. The apparatus of claim 93 wherein the end effector is configured to withdraw the substrate at a rate of approximately 0.25–5 mm/sec.

96. The apparatus of claim 68 wherein, further including a drain configured to perform a quick dump to discharge rinse fluid from the chamber, leaving residual process fluid on the surface of the substrate, wherein the source of drying vapor is for introducing a drying vapor into the chamber such that the drying vapor condenses on the surface of the substrate and reduces the surface tension of the residual process fluid, causing the residual process fluid to flow off of the surface.

97. The apparatus of claim 96 wherein the quick dump discharges the process fluid in less than approximately 5 seconds.

98. The apparatus of claim 68 wherein the drying vapor includes isopropyl alcohol vapor.

99. The apparatus of claim 68 further including a source of a heated gas fluidly coupled to the chamber to evaporate condensed drying vapor from the surface of the substrate.

100. The apparatus of claim 99, further including an outlet in the chamber for directing the heated gas in the chamber, and an end effector moveable to translate the substrate past the outlet to accelerate evaporation.

101. The apparatus of claim 68 wherein the source of chemical treatment fluid includes a source of etch fluid, and wherein the apparatus further includes a source of cleaning fluid fluidly coupled to the chamber.

102. The apparatus of claim 68 wherein the chamber includes a substrate-receiving member having a notch proportioned to receive a lower edge of a substrate, and wherein the apparatus further includes:

an end effector including a pair of substrate-receiving members, each substrate-receiving member having at least one stabilizing element and at least one engaging element, the end effector being moveable between
  a first position within the process chamber wherein a lower edge of a substrate is in contact with the notch and wherein each stabilizing element is positioned at a lateral edge of the substrate to restrict movement of the substrate; and
  a second position wherein the lower edge of the substrate is withdrawn from contact with the notch and wherein each engaging element supports a lateral edge of the substrate.

103. The apparatus of claim 102 wherein the at least one stabilizing element includes a slot oriented to receive a substrate edge within the slot to restrict movement of the substrate in a direction transverse to a plane containing the substrate, and a stabilizing member extending towards a substrate edge to restrict movement of the substrate in a lateral direction.

104. An apparatus for treating and drying a substrate, the apparatus comprising:
a chamber proportioned to process only a single substrate at a time, the chamber including a lower portion and an upper portion;
a source of a process fluid fluidly coupled to the lower portion of the chamber;
a source of drying vapor fluidly coupled to an upper portion of the chamber, to create an atmosphere of drying vapor in the upper portion;
an end effector having a substrate-receiving member moveable between the lower portion of the chamber and the upper portion of the chamber, said end effector operable to withdraw a substrate from process fluid in the lower portion into the atmosphere of drying vapor in the upper portion; and
a megasonic transducer positioned to direct megasonic energy into process fluid in the chamber, wherein the megasonic energy induces thinning of a boundary layer on the substrate as the substrate is moved from the process fluid into the atmosphere of drying vapor.

105. The apparatus of claim 104 wherein the transducer is position to form a band of megasonic energy propagating towards a surface of the substrate, wherein the end effector is positioned to move the substrate through the band, and wherein the megasonic energy induces thinning of a boundary layer on the portion of the substrate passing through the band.

106. The apparatus of claim 105 wherein the end effector is configured to withdraw the substrate through the band at a rate of approximately 8–30 mm/sec.

107. The apparatus of claim 104 wherein the megasonic transducer is oriented to propagate energy in a direction normal to the substrate surface.

108. The method of claim 104 wherein the megasonic transducer is oriented to propagate energy at an angle that is less than normal to the substrate surface.

109. The apparatus of claim 104 further including a source of heated gas fluidly coupled to the chamber to volatilize condensed drying vapor from a surface of a substrate.

110. The apparatus of claim 109, further including one or more inlets in the chamber for introduction of the heated gas into the chamber, and an end effector having a substrate-receiving portion moveable to translate a substrate past the inlets to accelerate evaporation.

111. The apparatus of claim 104 wherein the drying vapor includes isopropyl alcohol.

112. The apparatus of claim 104 wherein the apparatus includes a system, the chamber forming a part of the system, and wherein the apparatus further includes means for exhausting drying vapor from the system.

113. An apparatus for drying a substrate, the apparatus comprising:
a chamber proportioned to process only a single substrate at a time;
a source of process fluid fluidly coupled to the chamber to immerse a substrate in process fluid;
a dump opening formed in a lower portion of the vessel and a dump door moveable between an opened condition permitting discharge of fluid through the dump opening and a closed condition sealing the dump opening, the dump door operable to evacuate a volume of process fluid immersing the substrate in approximately 5 seconds or less, leaving residual process fluid on the surface of a substrate positioned within the vessel, and
a source of drying vapor fluidly coupled for introduction into the chamber, said drying vapor selected to condense on the surface of the substrate and to reduce the surface tension of residual process fluid on the surface, causing the residual process fluid to flow off of the surface.

114. The apparatus of claim 113 wherein the apparatus includes a system, the chamber forming a part of the system, and wherein the apparatus further includes means for exhausting drying vapor from the system.

115. The apparatus of claim 113 wherein the drying vapor includes isopropyl alcohol vapor.

116. The apparatus of claim 113 further including a source of heated gas fluidly coupled the chamber to volatilize condensed drying vapor from a surface of a substrate.

117. The apparatus of claim 116, further including one or more inlets in the chamber for introduction of the heated gas into the chamber, and an end effector having a substrate-receiving portion moveable to translate a substrate past the inlets to accelerate evaporation.

118. The method of claim 47 wherein the drying vapor is introduced into the system after the process fluid has been discharged from the chamber.

119. The method of claim 61 wherein step (d) is performed after the process fluid has been discharged from the chamber.

120. The apparatus of claim 96 wherein the source of drying vapor is for introducing a drying vapor into the chamber after a quick dump has been performed.

* * * * *

UNITED STATES PATENT AND TRADEMARK OFFICE
CERTIFICATE OF CORRECTION

PATENT NO. : 6,726,848 B2
DATED : April 27, 2004
INVENTOR(S) : Eric Hansen et al.

It is certified that error appears in the above-identified patent and that said Letters Patent is hereby corrected as shown below:

<u>Column 10,</u>
Line 28, change "$NH_2OH$" to -- $NH_4OH$ --.

<u>Column 17,</u>
Line 55, change "$NH_2OH$" to -- $NH_4OH$ --.

Signed and Sealed this

Twenty-first Day of September, 2004

JON W. DUDAS
*Director of the United States Patent and Trademark Office*